US012677560B2

(12) United States Patent
Liu et al.

(10) Patent No.: US 12,677,560 B2
(45) Date of Patent: Jul. 7, 2026

(54) DISPLAY SUBSTRATE AND MANUFACTURING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Changchang Liu, Beijing (CN); Xuewei Tian, Beijing (CN); Ling Shi, Beijing (CN); Liqiang Chen, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 451 days.

(21) Appl. No.: 18/267,787

(22) PCT Filed: Jul. 29, 2022

(86) PCT No.: PCT/CN2022/108888
§ 371 (c)(1),
(2) Date: Jun. 16, 2023

(87) PCT Pub. No.: WO2024/021002
PCT Pub. Date: Feb. 1, 2024

(65) Prior Publication Data
US 2024/0397777 A1 Nov. 28, 2024

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/1213* (2023.02);
(Continued)

(58) Field of Classification Search
CPC .. H10K 59/1213; H10K 59/98; H10K 59/131; H10K 59/1216; H10K 59/873;
(Continued)

(56) References Cited

U.S. PATENT DOCUMENTS

2006/0164582 A1 7/2006 Kim et al.
2014/0125901 A1 5/2014 Tong et al.
(Continued)

FOREIGN PATENT DOCUMENTS

CN 101118355 A 2/2008
CN 102629611 A 8/2012
(Continued)

*Primary Examiner* — Vongsavanh Sengdara
(74) *Attorney, Agent, or Firm* — Ling Wu; Stephen Yang; Ling and Yang Intellectual Property

(57) ABSTRACT

A display substrate, a manufacturing method therefor, and a display apparatus are disclosed. The display substrate includes a display area (100), a bonding area (200) and a bezel area (300). On a plane perpendicular to the display substrate, the display substrate includes a base substrate (101) and a driving circuit layer (102). The substrate (101) at least includes a base conductive layer disposed between a first flexible layer (10A) and a second flexible layer (10C), the base conductive layer at least includes a first connection line (70), the driving circuit layer (102) at least includes a data signal line (60) and a second connection line (80), the second connection line (80) is connected to the first connection line (70) through a first lapping via (DV1), the data signal line (60) is connected to the second connection line (80) through a second lapping via (DV2).

19 Claims, 14 Drawing Sheets

(51) Int. Cl.

| | | |
|---|---|---|
| *H10K 59/121* | (2023.01) | |
| *H10K 59/80* | (2023.01) | |
| *H10K 59/88* | (2023.01) | |
| *H10K 77/10* | (2023.01) | |

(52) U.S. Cl.
CPC ....... *H10K 59/1216* (2023.02); *H10K 59/873* (2023.02); *H10K 59/88* (2023.02); *H10K 77/111* (2023.02)

(58) Field of Classification Search
CPC ........... H10K 59/1315; H10K 59/1201; H10K 77/111
See application file for complete search history.

(56) References Cited

U.S. PATENT DOCUMENTS

| | | | |
|---|---|---|---|
| 2019/0278145 A1* | 9/2019 | Tanaka .............. | G02F 1/136286 |
| 2020/0341516 A1* | 10/2020 | Huang .................. | G06F 1/1637 |
| 2021/0391398 A1* | 12/2021 | Ouyang .............. | H10K 59/124 |
| 2022/0271059 A1* | 8/2022 | Feng ................. | G02F 1/133345 |
| 2023/0043145 A1 | 2/2023 | Yuan et al. | |
| 2024/0196700 A1* | 6/2024 | Liu ...................... | H10K 59/873 |

FOREIGN PATENT DOCUMENTS

| | | |
|---|---|---|
| CN | 103022375 A | 4/2013 |
| CN | 107994055 A | 5/2018 |
| CN | 109791745 A | 5/2019 |
| CN | 112310125 A | 2/2021 |
| CN | 112885870 A | 6/2021 |
| CN | 113838994 A | 12/2021 |
| KR | 1998031762 A | 7/1998 |

* cited by examiner

DISPLAY SUBSTRATE AND MANUFACTURING METHOD THEREFOR, AND DISPLAY APPARATUS

CROSS-REFERENCE TO RELATED APPLICATION

The present application is a U.S. National Phase Entry of International Application No. PCT/CN2022/108888 having an international filing date of Jul. 29, 2022. The above-identified application is hereby incorporated by reference.

TECHNICAL FIELD

The present disclosure relates to, but is not limited to, the field of display technologies, and particularly to a display substrate and a manufacturing method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate, including a display area, a bonding area located at one side of the display area and a bezel area located at other sides of the display area; on a plane perpendicular to the display substrate, the display substrate includes a base substrate and a driving circuit layer disposed on the base substrate, the base substrate at least includes a first flexible layer, a second flexible layer and a base substrate conductive layer disposed between the first flexible layer and the second flexible layer, the base substrate conductive layer at least includes a first connection line, the driving circuit layer at least includes a data signal line and a second connection line, the second connection line is connected with the first connection line through a first lapping via, the data signal line is connected with the second connection line through a second lapping via, the first lapping via is provided in the bezel area.

In an exemplary implementation, the bonding area at least includes a plurality of lead lines, first ends of the plurality of lead lines are correspondingly connected with an integrated circuit in the bonding area, second ends of the plurality of lead lines are correspondingly connected with first ends of a plurality of first connection lines, second ends of the plurality of first connection lines pass through the display area from the bonding area and extend to the bezel area and then connected with first ends of the second connection lines through the first lapping via, second ends of the second connection lines extend from the bezel area to the display area and then connected with the data signal line through the second lapping via.

In an exemplary implementation, the driving circuit layer at least includes a first conductive layer, a second conductive layer and a third conductive layer that are sequentially arranged on the base substrate, wherein the second connection line is disposed in the second conductive layer, the data signal line is disposed in the third conductive layer.

In an exemplary implementation, an orthographic projection of the second connection line on the base substrate is at least partially overlapped with an orthographic projection of the first connection line on the base substrate.

In an exemplary implementation, an orthographic projection of the second connection line on the base substrate is within a range of an orthographic projection of the first connection line on the base substrate.

In an exemplary implementation, a first width between an edge of the first lapping via and an edge of the first connection line is greater than or equal to 2.5 μm, the first width is a dimension in a direction away from the first lapping via.

In an exemplary implementation, the second connection line covers the first connection line exposed in the bottom inside the first lapping via and an inorganic layer exposed in an sidewall inside the first lapping via, and the second connection line covers the insulation layer outside the first lapping via. A second width of the insulation layer covered by the second connection line is greater than or equal to 2.5 μm, and the second width is a dimension in a direction away from the first lapping via.

In an exemplary implementation, the second lapping via is provided at a side of the display area away from the bonding area.

In an exemplary implementation, the bonding area is located at a side of the display area in a second direction, the bezel area at least includes an upper bezel area located at a side of the display area away from the bonding area and a side bezel area located at at least one side of the display area in a first direction, the first direction crosses the second direction, and the first lapping via is respectively provided in the upper bezel area and the side bezel area.

In an exemplary implementation, the upper bezel area includes a first encapsulation area and a first non-encapsulation area divided by an encapsulation line, wherein the encapsulation line is a boundary of the encapsulation structure layer covering the upper bezel area, the first encapsulation area is disposed at a side of the encapsulation line close to the display area, the first non-encapsulation area is disposed at a side of the encapsulation line away from the display area, and the first lapping via is provided in the first non-encapsulation area.

In an exemplary implementation, the first encapsulation area at least includes a plurality of electrostatic discharge circuits, the electrostatic discharge circuit at least includes an electrostatic transistor and an electrostatic capacitor, the orthographic projection of the first connection line on the base substrate is not overlapped with orthographic projections of the electrostatic transistor and the electrostatic capacitor in the electrostatic discharge circuit on the base substrate, and the orthographic projection of the second connection line on the base substrate is not overlapped with the orthographic projections of the electrostatic transistor and the electrostatic capacitor in the electrostatic discharge circuit on the base substrate.

In an exemplary implementation, the side bezel area includes a second encapsulation area and a second non-encapsulation area divided by an encapsulation line, wherein the encapsulation line is a boundary of the encapsulation structure layer covering the side bezel area, the second encapsulation area is disposed at a side of the encapsulation line close to the display area, the second non-encapsulation area is disposed at a side of the encapsulation line away from the display area, and the first lapping via is provided in the second non-encapsulation area.

In an exemplary implementation, the second encapsulation area at least includes a plurality of row driving circuits, the row driving circuits at least includes a row driving transistor and a row driving capacitor, the orthographic projection of the first connection line on the base substrate is not overlapped with orthographic projection of the row driving transistor and the row driving capacitor in the row driving circuit on the base substrate, and the orthographic projection of the second connection line on the base substrate is not overlapped with the orthographic projections of the row driving transistor and row driving capacitor in the row driving circuit on the base substrate.

In an exemplary implementation, the row driving circuit is connected to a clock signal line configured to output a clock signal to the row driving circuit, the row driving circuit outputs a scan signal according to the clock signal, the clock signal line is respectively provided in the upper bezel area and the side bezel area.

In an exemplary implementation, the clock signal line of the upper bezel area is provided with a fracture, the fracture cuts off the clock signal line of the upper bezel area.

In an exemplary implementation, the bezel area further includes a bezel corner at a junction area of the upper bezel area and the side bezel area, and the bezel corner is provided with at least one first lapping via, at least one first connection line and at least one second connection line.

In an exemplary implementation, the bezel corner is provided with at least one dummy lapping via, at least one first dummy line and at least one second dummy line. After the first dummy line extends from the display area to the bezel corner, the first dummy line is connected with the second dummy line through the dummy lapping via, the second dummy line extends from the bezel corner to the display area, and the second dummy line is not connected with the data signal line.

In another aspect, the present disclosure further provides a display apparatus, including the aforementioned display substrate.

In yet another aspect, the present disclosure further provides a manufacturing method for a display substrate, the display substrate includes a display area, a bonding area located at a side of the display area and a bezel area located at other sides of the display area; the manufacturing method includes:

forming a base substrate, wherein the base substrate at least includes a first flexible layer, a second flexible layer, and a base substrate conductive layer disposed between the first flexible layer and the second flexible layer, the base conductive layer at least includes a first connection line;

forming a driving circuit layer on the base substrate, wherein the driving circuit layer at least includes a data signal line and a second connection line, the second connection line is connected with the first connection line through a first lapping via, the data signal line is connected with the second connection line through a second lapping via, the first lapping via is provided in the bezel area.

Other aspects may be understood upon reading and understanding drawings and detailed description.

BRIEF DESCRIPTION OF DRAWINGS

The accompanying drawings are used for providing understanding of technical solutions of the present disclosure, and constitute a part of the specification. They are used for explaining the technical solutions of the present disclosure together with the embodiments of the present disclosure, but do not constitute a limitation on the technical solutions of the present disclosure.

Figure 1:
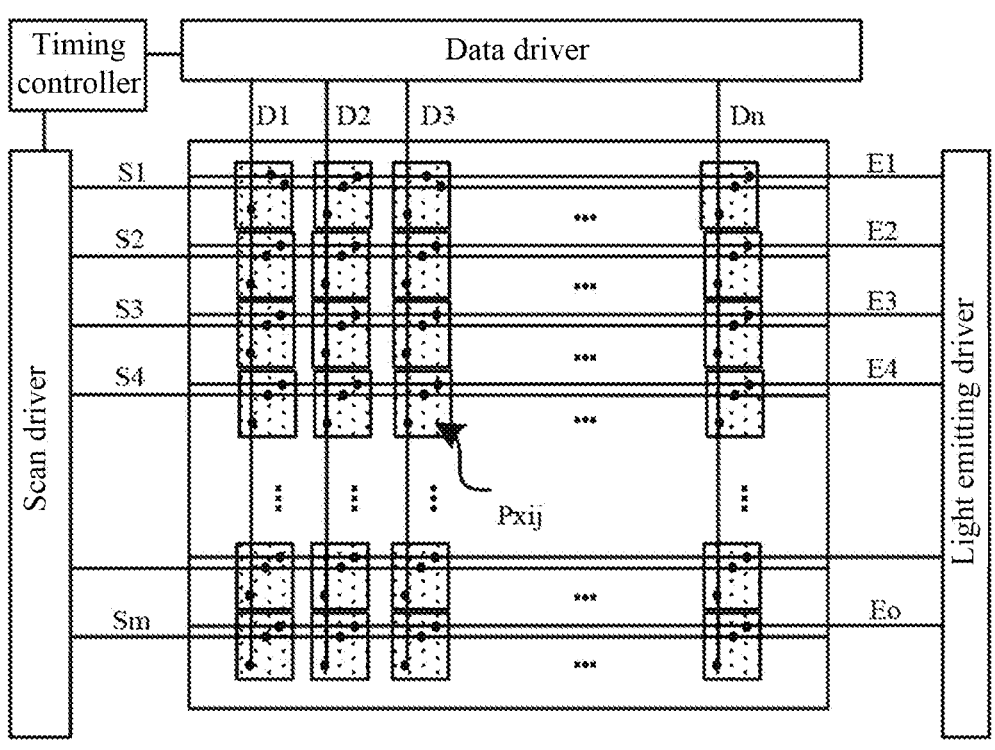
FIG. 1 is a schematic diagram of a structure of a display apparatus.

Reference signs are described as follows.

| 10A-first flexible layer; | 10B-first barrier layer; | 10C-second flexible layer; |
| 10D-second barrier layer; | 11-first active layer; | 12-second active layer; |
| 13-third active layer; | 14-fourth active layer; | 15-fifth active layer; |

-continued

| | | |
|---|---|---|
| 16-sixth active layer; | 17-seventh active layer; | 21-first scan signal line; |
| 22-second scan signal line; | 23-light emitting control line; | 24-first plate; |
| 31-initial signal line; | 32-second plate; | 33-plate connection line; |
| 34-opening; | 41-first connection electrode; | 42-second connection electrode; |
| 43-third connection electrode; | 44-first power supply line; | 60-data signal line; |
| 70-first connection line; | 70X-first dummy line; | 70A-extension line; |
| 71-first sub-line; | 72-second sub-line; | 73-first connection block; |
| 80-second connection line; | 80X-second dummy line; | 81-third sub-line; |
| 82-fourth sub-line; | 83-second connection block; | 91-first insulation layer; |
| 92-second insulation layer; | 93-third insulation layer; | 94-fourth insulation layer; |
| 100-display area; | 101-substrate; | 102-driving circuit layer; |
| 103-light emitting structure layer; | 104-encapsulation structure layer; | 200-bonding area; |
| 201-lead line area; | 202-bending area; | 220-lead line; |
| 300-bezel area; | 310-upper bezel area; | 310A-first encapsulation area; |
| 310B-first non-encapsulation area; | 311-electrostatic circuit area; | 312-first isolation dam area; |
| 320-side bezel area; | 320A-second encapsulation area; | 320B-second non-encapsulation area; |
| 321-gate circuit area; | 322-second isolation dam area; | 330-electrostatic discharge circuit; |
| 340-row driving circuit; | 350-clock signal line; | 360-fracture; |
| 410-first isolation dam; | 420-second isolation dam; | |

DETAILED DESCRIPTION

To make objectives, technical solutions, and advantages of the present disclosure more clear, the embodiments of the present disclosure will be described in detail with reference to the accompanying drawings. It is to be noted that implementations may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

Scales of the drawings in the present disclosure may be used as a reference in an actual process, but are not limited thereto. For example, a width-length ratio of a channel, a thickness of each film layer and a space between two film layers, and a width of each signal line and a space between two signal lines may be adjusted according to actual needs. A quantity of pixels in a display substrate and a quantity of sub-pixels in each pixel are not limited to numbers shown in the drawings. The drawings described in the present disclosure are structural schematic diagrams only, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation, therefore should not be understood as limitations to the present disclosure. The positional relationships between the constituent elements are changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or an electrical connection; it may be a direct mutual connection, or an indirect connection through middleware, or internal communication between two elements. Those of ordinary skill in the art may understand specific meanings of these terms in the present disclosure according to specific situations.

In the specification, a transistor refers to an element which at least includes three terminals, i.e., a gate electrode, a drain electrode, and a source electrode. The transistor has a channel area between the drain electrode (drain electrode terminal, drain area, or drain) and the source electrode (source electrode terminal, source area, or source), and a current can flow through the drain electrode, the channel area, and the source electrode. It is to be noted that, in the specification, the channel area refers to an area through which the current mainly flows.

In the specification, a first electrode may be a drain electrode, and a second electrode may be a source electrode. Or, a first electrode may be a source electrode, and a second electrode may be a drain electrode. In a case that transistors with opposite polarities are used, in a case that a direction of a current is changed during operation of a circuit, or the like, functions of the "source electrode" and the "drain electrode" are sometimes interchangeable. Therefore, the "source electrode" and the "drain electrode", as well as the "source terminal" and the "drain terminal", are interchangeable in the specification.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in this specification are not strictly defined, and it may be an approximate triangle, rectangle, trapezoid, pentagon, or hexagon, etc. There may be some small deformation caused by tolerance, and there may be a chamfer, an arc edge, and deformation, etc. In the present disclosure, "about" refers to that a boundary is not defined so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light-emitting driver and a pixel array. The timing controller is connected to the data driver, the scan driver and the light-emitting driver, respectively, the data driver is connected to a plurality of data signal lines (D1 to Dn) respectively, the scan driver is connected to a plurality of scan signal lines (S1 to Sm) respectively, and the light emitting driver is connected to a plurality of light-emitting signal lines (E1 to Eo) respectively. The pixel array may include a plurality of sub-pixels Pxij, wherein both of i and j may be natural numbers. At least one of the sub-pixels Pxij may include a circuit unit and a light emitting device connected to the circuit unit, wherein the circuit unit may at least include a pixel driving circuit that is connected to a scan signal line, a data signal line and a pixel driving circuit, respectively. In an exemplary implementation, the timing controller may provide the data driver with a gray scale value and a control signal which are suitable for a specification of the data driver, provide the scan driver with a clock signal, a scan start signal, etc., which are suitable for a specification of the scan driver, and provide the light emitting driver with a clock signal, an emission stop signal, etc., which are suitable for a specification of the light emitting driver. The data signal driver may generate a data voltage to be provided to the data signal lines D1, D2, D3, . . . , and Dn by using the gray scale value and the control signal that are received from the timing controller. For example, the data driver may sample the gray-scale value by using the clock signal and apply a data voltage corresponding to the gray-scale value to the data signal lines D1 to Dn by taking a pixel row as a unit, wherein n may be a natural number. The scan driver may generate a scan signal to be provided to the scan signal lines S1, S2, S3, . . . , and Sm by receiving the clock signal, the scan start signal, etc., from the timing controller. For example, the scan signal driver may sequentially provide a scan signal with an on-level pulse to the scan signal lines S1 to Sm. For example, the scan driver may be configured in a form of a shift register and may generate a scan signal in a manner in which the scan start signal provided in a form of an on-level pulse is transmitted to a circuit in a next stage sequentially under the control of the clock signal, wherein m may be a natural number. The light emitting driver may generate an emission signal to be provided to the light emitting signal lines E1, E2, E3, . . . , and Eo by receiving the clock signal, the emission stop signal, etc., from the timing controller. For example, the light emitting driver may provide an emission signal with an off-level pulse to the light emitting signal lines E1 to Eo sequentially. For example, the light emitting driver may be constructed in a form of a shift register and may generate an emission signal in a manner in which an emission stop signal provided in a form of an off-level pulse is transmitted to a next-stage circuit sequentially under control of the clock signal, wherein o may be a natural number.

Figure 2:
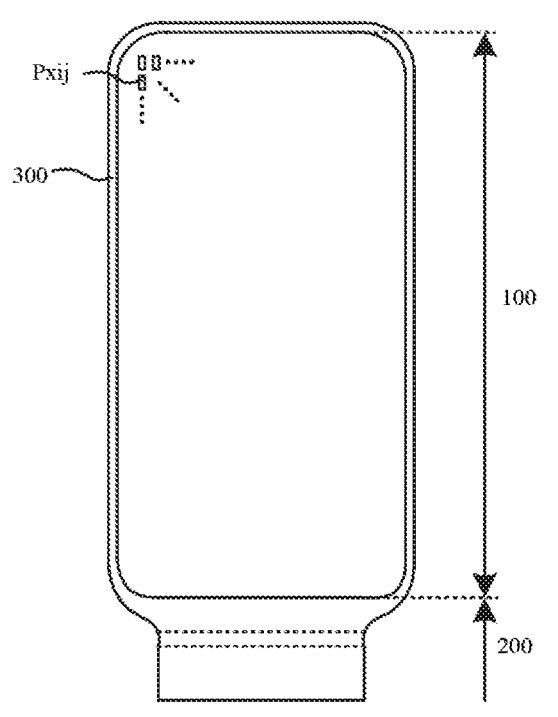
FIG. 2 is a schematic diagram of a structure of a display substrate.

FIG. 2 is a schematic diagram of a structure of a display substrate. As shown in FIG. 2, the display substrate may include a display area 100, a bonding area 200 located at a side of the display area 100, and a bezel area 300 located at other sides of the display area 100. In an exemplary implementation, the display area 100 may be a planar area including a plurality of sub-pixels Pxij that form a pixel array. The plurality of sub-pixels Pxij are configured to display a dynamic picture or a still image, and the display area 100 may be referred to as an Active Area (AA for short). In an exemplary implementation, the display substrate may be deformable, e.g., may be crimped, bent, folded, or curled.

In an exemplary implementation, the bonding area 200 may include a fan-out area, a bending area, a driver chip area, and a bonding pin area that are disposed sequentially along a direction away from the display area 100. The fan-out area is connected to the display area 100 and may at least include a plurality of data fan-out lines configured to connect data signal lines of the display area in a Fan-out trace manner. The bending area is connected to the fan-out area and may include a composite insulation layer provided with a groove, and is configured to enable the bonding area to be bent to a back surface of the display area. The driver chip area may include an Integrated Circuit (IC for short) and is configured to be connected with the plurality of data fan-out lines. The bonding pin area may at least include a plurality of bonding pads, and is configured to bond to and connect to an external Flexible Printed Circuit (FPC for short).

In an exemplary implementation, the bezel area 300 may include a circuit area, a power supply line area, a crack dam area, and a cutting area which are sequentially disposed along the direction away from the display area 100. The circuit area is connected to the display area 100 and may at least include a gate driving circuit which is connected with a first scan signal line, a second scan signal line, and a light emitting control line of a pixel driving circuit in the display area 100. The power supply line area is connected to the circuit area and may at least include a bezel power supply wire that extends along a direction parallel to an edge of the display area and is connected with a cathode in the display area 100. The crack dam area is connected to the power supply line area and may at least include a plurality of cracks disposed on the composite insulation layer. The cutting area is connected to the crack dam area and may at least include a cutting groove disposed on the composite insulation layer, and the cutting groove is configured for cutting by a cutting device along the cutting groove respectively after all film layers of the display substrate are prepared.

In an exemplary implementation, the fan-out area in the bonding area 200 and the power supply line area in the bezel area 300 may be provided with a first isolation dam and a second isolation dam, the first isolation dam and the second isolation dam may extend in a direction parallel to the edge of the display area 100, forming an annular structure surrounding the display area 100, wherein the edge of the display area is an edge on a side of the display area close to the bonding area or close to the bezel area.

Figure 3:
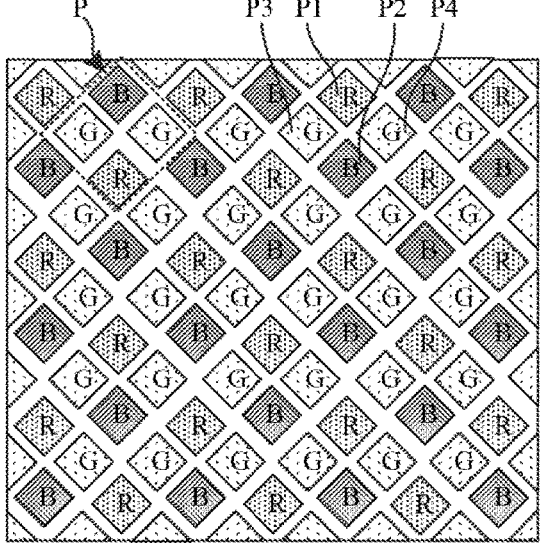
FIG. 3 is a schematic diagram of a planar structure of a display area in a display substrate.

FIG. 3 is a schematic diagram of a planar structure of a display area in a display substrate. As shown in FIG. 3, the display substrate may include a plurality of pixel units P arranged in a matrix. At least one pixel unit P includes a first sub-pixel P1 emitting light of a first color, a second sub-pixel P2 emitting light of a second color, a third sub-pixel P3 and a fourth sub-pixel P4 which emit light of a third color. Each sub-pixel may include a circuit unit and a light emitting device, wherein the circuit unit may at least include a pixel driving circuit, the pixel driving circuit is connected with a scan signal line, a data signal line, and a light emitting signal line respectively, and the pixel driving circuit is configured to receive a data voltage transmitted by the data signal line and output a corresponding current to the light emitting device under control of the scan signal line and the light emitting signal line. The light emitting device in each sub-pixel is connected with a pixel driving circuit of a sub-pixel where the light emitting device is located, and is configured to emit light with corresponding brightness in response to a current output by the pixel driving circuit connected with the light emitting device.

In an exemplary implementation, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation, the shape of the sub-pixel may be rectangle, diamond, pentagonal, hexagonal. The four sub-pixels may be arranged in a manner of diamond to form an RGBG pixel arrangement. In other exemplary implementations, the four sub-pixels may be arranged side by side horizontally, side by side vertically, or in a square-shaped manner, which is not limited in the present disclosure.

In an exemplary implementation, each pixel unit may include three sub-pixels, and the three sub-pixels may be arranged side by side horizontally, side by side vertically, or in a delta-shaped arrangement, which is not limited in the present disclosure.

Figure 4:
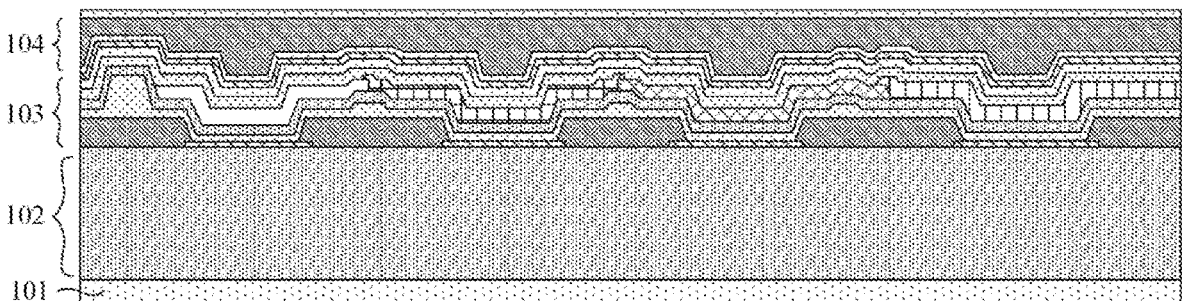
FIG. 4 is a schematic diagram of a sectional structure of a display area in a display substrate.

FIG. 4 is a schematic diagram of a cross-sectional structure of a display area in a display substrate, illustrating a structure of four sub-pixels in the display area. As shown in FIG. 4, in a plane perpendicular to the display substrate, the display substrate may include a driving circuit layer 102 disposed on a base substrate 101, a light emitting structure layer 103 disposed at a side of the driving circuit layer 102 away from the base substrate 101, and an encapsulation structure layer 104 disposed at a side of the light emitting structure layer 103 away from the base substrate 101. In some possible implementations, the display substrate may include other film layers, such as a touch structure layer, which is not limited here in the present disclosure.

In an exemplary implementation, the base substrate 101 may be a flexible base substrate, or a rigid base substrate. The driving circuit layer 102 may include a plurality of circuit units, the circuit unit may at least includes a pixel driving circuit. The light emitting structure layer 103 at least includes a plurality of light emitting devices, each of the light emitting devices at least includes an anode, an organic light emitting layer and a cathode, wherein the organic light emitting layer is driven by the anode and the cathode to emit light of a corresponding color. The light emitting structure layer 103 may further include a pixel definition layer covering the anode, and a pixel opening is provided on the pixel definition layer and exposes a surface of the anode. The encapsulation layer 104 may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is disposed between the first encapsulation layer and the third encapsulation layer to form an inorganic material/organic material/inorganic material laminated structure and ensure that external water and oxygen cannot enter the light emitting structure layer 103.

In an exemplary implementation, the organic emitting layer may include an Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation, one or more layers of hole injection layers, hole transport layers, electron barrier layers, hole barrier layers, electron transport layers, and electron injection layers of all sub-pixels may be a common layer communicated together. Emitting layers of adjacent sub-pixels may be overlapped slightly, or may be mutually isolated.

Figure 5:
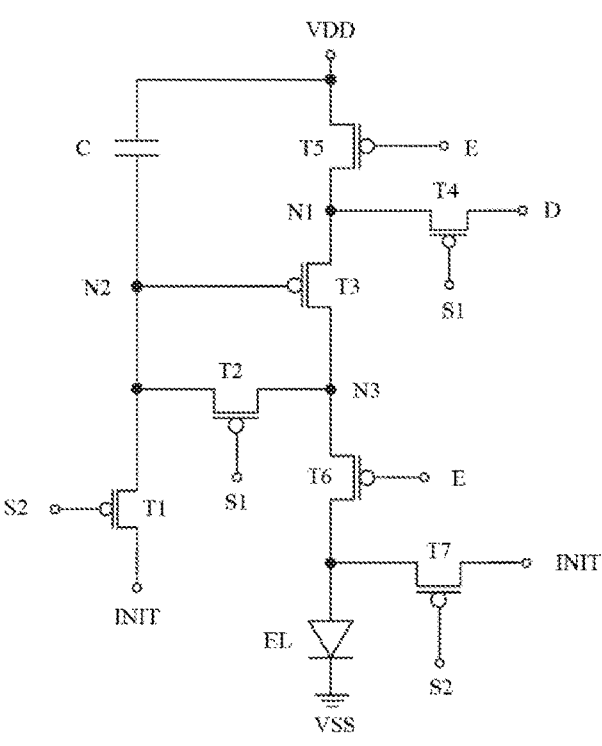
FIG. 5 is a schematic diagram of an equivalent circuit of a pixel driving circuit.

FIG. 5 is a schematic diagram of an equivalent circuit of a pixel driving circuit. In an exemplary implementation, the pixel driving circuit may have a structure of 3T1C, 4T1C, 5T1C, 5T2C, 6T1C, 7T1C, or 8T1C. As shown in FIG. 5, the pixel driving circuit may include seven transistors (a first transistor T1 to a seventh transistor T7), one storage capacitor C. The pixel driving circuit is connected with seven signal lines (a data signal line D, a first scan signal line S1, a second scan signal line S2, a light emitting signal line E, an initial signal line INIT, a first power supply line VDD, and a second power supply line VSS) respectively.

In an exemplary implementation, the pixel driving circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a gate electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation, a first end of the storage capacitor C is connected with the first power line VDD, and a second end of the storage capacitor C is connected with a second node N2, namely the second end of the storage capacitor C is connected with a gate electrode of the third transistor T3.

A gate electrode of the first transistor T1 is connected with the second scan signal line S2, a first electrode of the first transistor T1 is connected with the initial signal line INIT, and a second electrode of the first transistor is connected with the second node N2. When a scan signal with an on-level is applied to the second scan signal line S2, the first transistor T1 transmits an initialization voltage to the gate electrode of the third transistor T3 so as to initialize a charge amount of the gate electrode of the third transistor T3.

A gate electrode of the second transistor T2 is connected to the first scan signal line S1, a first electrode of the second transistor T2 is connected to the second node N2, and a second electrode of the second transistor T2 is connected to a third node N3. When a scan signal with an on-level is applied to the first scan signal line S1, the second transistor T2 enables the gate electrode of the third transistor T3 to be connected with a second electrode of the third transistor T3.

The gate electrode of the third transistor T3 is connected with the second node N2, namely the gate electrode of the third transistor T3 is connected with the second end of the storage capacitor C, a first electrode of the third transistor T3 is connected with a first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the gate electrode and the first electrode of the third transistor T3.

A gate electrode of the fourth transistor T4 is connected to the first scan signal line S1, a first electrode of the fourth transistor T4 is connected to the data signal line D, and a second electrode of the fourth transistor T4 is connected to the first node N1. The fourth transistor T4 may be referred to as a switching transistor, a scan transistor, etc., and when a scan signal with an on-level is applied to the first scan signal line S1, the fourth transistor T4 enables a data voltage of the data signal line D to be input to the pixel driving circuit.

A gate electrode of the fifth transistor T5 is connected with the light emitting signal line E, a first electrode of the fifth transistor T5 is connected with the first power line VDD, and a second electrode of the fifth transistor T5 is connected with the first node N1. A gate electrode of the sixth transistor T6 is connected with the light emitting signal line E, a first electrode of the sixth transistor T6 is connected with the third node N3, and a second electrode of the sixth transistor T6 is connected with a first electrode of the light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device EL to emit light by forming a drive current path between the first power supply line VDD and the second power supply line VSS.

A gate electrode of the seventh transistor T7 is connected to the second scan signal line S2, a first electrode of the seventh transistor T7 is connected to the initial signal line INIT, and a second electrode of the seventh transistor T7 is connected to the first electrode of the light emitting device EL. When a scan signal with an on-level is applied to the second scan signal line S2, the seventh transistor T7 transmits an initialization voltage to the first electrode of the light emitting device EL so as to initialize a charge amount accumulated in the first electrode of the light emitting device EL or release a charge amount accumulated in the first electrode of the light emitting device EL.

In an exemplary implementation, the light emitting device EL may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary implementation, a second electrode of the light emitting device EL is connected with the second power supply line VSS, a signal of the second power supply line VSS is a low-level signal continuously provided, and a signal of the first power supply line VDD is a high-level signal continuously provided.

In an exemplary implementation, the first transistor T1 to the seventh transistor T7 may be P-type transistors, or may be N-type transistors. Use of a same type of transistors in a pixel driving circuit may simplify a process flow, reduce process difficulties of a display panel, and improve a yield of products. In some possible implementations, the first transistor T1 to the seventh transistor T7 may include a P-type transistor and an N-type transistor.

In an exemplary implementation, for the first transistor T1 to the seventh transistor T7, low temperature poly-silicon thin film transistors may be adopted, or oxide thin film transistors may be adopted, or a low temperature poly-silicon thin film transistor and an oxide thin film transistor may be adopted. An active layer of a low temperature poly-silicon thin film transistor may be made of Low Temperature Poly-Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

Taking all of the seven transistors being N-type transistors as an example, the operation process of the pixel driving circuit may include the following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signals, which causes the first transistor T1 and the seventh transistor T7 to be turned on. The first transistor T1 is turned on such that the initial voltage of the initial signal line INIT is provided to a second node N2 to initialize the storage capacitor C to clear an original data voltage in the storage capacitor. The seventh transistor T7 is turned on such that an initialization voltage of the initial signal line INIT is provided to a first electrode of the OLED to initialize (reset) the first electrode of the OLED and clear a pre-stored voltage therein, thereby completing initialization. The signals of the first scan signal line S1 and the light emitting signal line E are high-level signals, so that the second transistor T2, the fourth transistor T4, the fifth transistor T5 and the sixth transistor T6 are turned off. The OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the second end of the storage capacitor C is at a low level, so the third transistor T3 is turned on. The signal of the first scan signal line S1 is a low-level signal, so that the second transistor T2 and the fourth transistor T4 are turned on. The second transistor T2 and the fourth transistor T4 are turned on, so that the data voltage output by the data signal line D is provided to the second node N2 through the first node N1, the turned-on third transistor T3, the third node N3 and the turned-on second transistor T2, and a difference between the data voltage output by the data signal line D and a threshold voltage of the third transistor T3 is charged into the storage capacitor C. A voltage of the second end (the second node N2) of the storage capacitor C is Vd−|Vth|, Vd is the data voltage output by the data signal line D, and Vth is the threshold voltage of the third transistor T3. A signal of the second scan signal line S2 is a high-level signal, so that the first transistor T1 and the seventh transistor T7 are turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel driving circuit, a drive current flowing through the third transistor T3 (drive transistor) is determined by a voltage difference between the gate electrode and the first electrode of the third transistor T3. The voltage of the second node N2 is Vdata−|Vth|, so the drive current of the third transistor T3 is as follows.

$$I=K*(Vgs-Vth)^2=K*[(Vdd-Vd+|Vth|)-Vth]^2=K* [(Vdd-Vd)]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With development of OLED display technologies, consumers have higher requirements for a display effect of a display product. An extremely narrow bezel has become a new trend in development of display products, so bezel narrowing or even a bezel-less design has been receiving more attention in the design of OLED display products. In a display substrate, the data fan-out line is arranged in the fan-out area of the bonding area. Because the width of the fan-out area is smaller than the width of the display area, the data fan-out line may be introduced into a wider display area through the fan-out route. The larger the width difference between the display area and the bonding area, the more oblique fan-out lines in the fan-shaped area, the larger the space occupied by the fan-shaped area. In addition, with gradually increasing resolution of display screens, occupied width of fan-out lines gradually increases, which makes it difficult to narrow a lower bezel, and a width of the lower bezel is about 2.0 mm for a long period.

A display substrate is provided in an exemplary embodiment of the present disclosure, in which the data connection line is located in the display area, which is referred to as Fan-out in AA (FIAA for short). One end of each of a plurality of data connection lines is correspondingly connected with one of a plurality of data signal lines in the display area, another end of each of the plurality of data connection lines extends to a bonding area and is correspondingly connected with an integrated circuit in the bonding area. Because oblique lines fan-shaped are not needed to the bonding area, the width of the fan-out area is reduced, then the width of the lower bezel is effectively reduced.

In an exemplary implementation, on a plane parallel to the display substrate, the display substrate may at least include a display area, a bonding area located at a side of the display area, and a bezel area located at other sides of the display area. On a plane perpendicular to the display substrate, the display substrate may include a driving circuit layer disposed on the base substrate, a light emitting structure layer disposed at a side of the driving circuit layer away from the base substrate, and an encapsulation structure layer disposed at a side of the light emitting structure layer away from the base substrate.

In an exemplary implementation, the base substrate may at least include a first flexible layer, a second flexible layer, and a base substrate conductive layer disposed between the first flexible layer and the second flexible layer. The driving circuit layer of the display area may include a plurality of unit rows and a plurality of unit columns. At least one circuit unit may include a pixel driving circuit configured to output a corresponding current to the light emitting device connected with the pixel driving circuit. The light emitting structure layer in the display area may include a plurality of sub-pixels forming a pixel array, at least one sub-pixel may include a light emitting device connected to a pixel driving circuit of a corresponding circuit unit, and the light emitting device is configured to emit light of a corresponding brightness in response to a current output by the pixel driving circuit connected with light emitting device.

In an exemplary implementation, a sub-pixel in the present disclosure refers to an area divided according to a light emitting device, and a circuit unit in the present disclosure refers to an area divided according to a pixel driving circuit. In an exemplary implementation, a position of an orthographic projection of the sub-pixel on the base substrate may correspond to a position of an orthographic projection of the circuit unit on the base substrate; alternatively, a position of an orthographic projection of the sub-pixel on the base substrate may not correspond to a position of an orthographic projection of the circuit unit on the base substrate.

In an exemplary implementation, a display substrate provided by the present disclosure may include a display area, a bonding area located at one side of the display area and a bezel area located at other sides of the display area; on a plane perpendicular to the display substrate, the display substrate includes a base substrate and a driving circuit layer disposed on the base substrate, the base substrate at least includes a first flexible layer, a second flexible layer and a base substrate conductive layer disposed between the first flexible layer and the second flexible layer, the base substrate conductive layer at least includes a first connection line, the driving circuit layer at least includes a data signal line and a second connection line, the second connection line is connected with the first connection line through a first lapping via, the data signal line is connected with the second connection line through a second lapping via, the first lapping via is provided in the bezel area.

In an exemplary implementation, the first connection line and the second connection line form a data connection line.

In an exemplary implementation, the bonding area at least includes a plurality of lead lines, first ends of the plurality of lead lines are correspondingly connected with an integrated circuit in the bonding area, second ends of the plurality of lead lines are correspondingly connected with first ends of a plurality of first connection lines, second ends of the plurality of first connection lines pass through the display area from the bonding area and extend to the bezel area and then connected with first ends of the second connection lines through the first lapping via, second ends of the second connection lines extend from the bezel area to the display area and then connected with the data signal line through the second lapping via.

In an exemplary implementation, the driving circuit layer at least includes a first conductive layer, a second conductive layer and a third conductive layer that are sequentially arranged on the base substrate, wherein the second connection line is disposed in the second conductive layer, the data signal line is disposed in the third conductive layer.

In an exemplary implementation, an orthographic projection of the second connection line on the base substrate is at least partially overlapped with an orthographic projection of the first connection line on the base substrate.

In an exemplary implementation, in the bezel area, an orthographic projection of the second connection line on the base substrate is within a range of an orthographic projection of the first connection line on the base substrate.

Figure 6A:
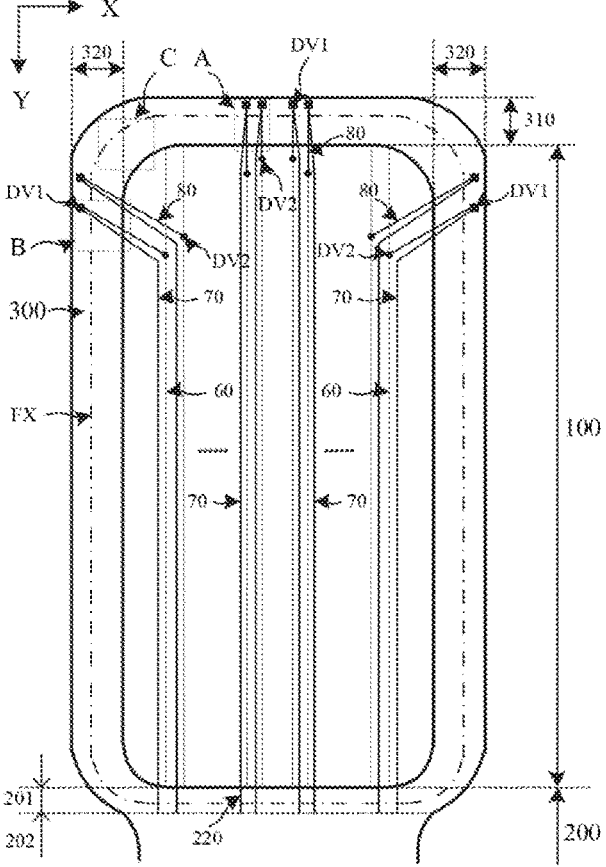
FIG. 6A to FIG. 6C are schematic diagrams of a planar structure of a display substrate according to an exemplary embodiment of the present disclosure.
Figure 6B:
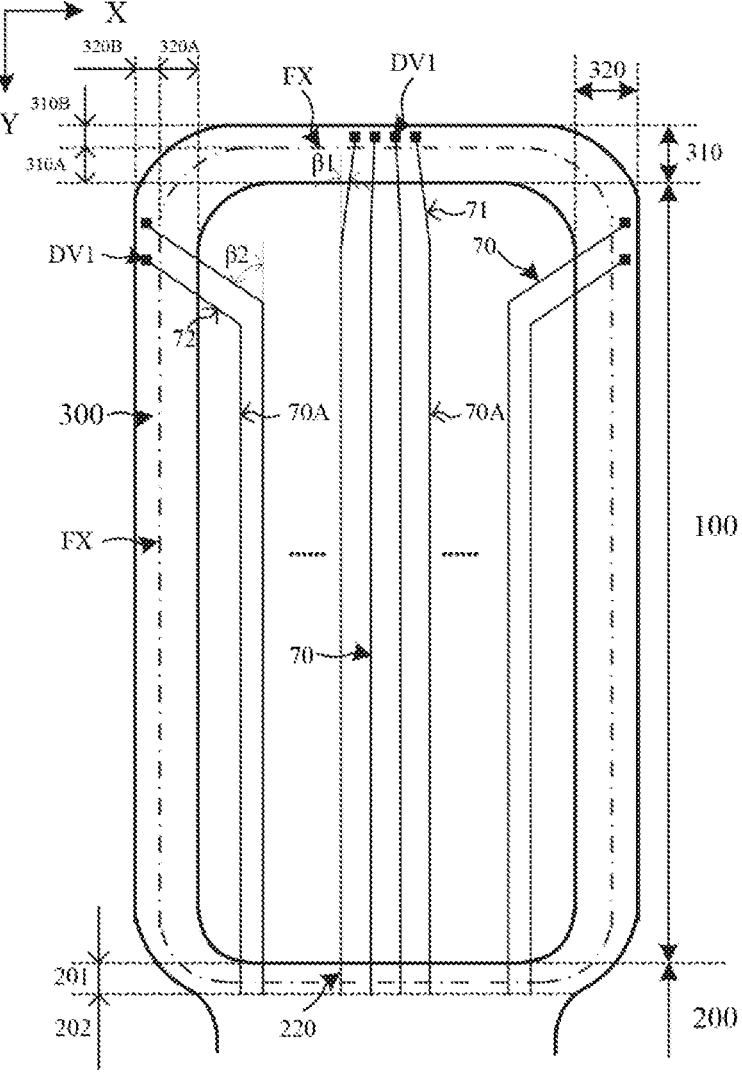
Figure 6C:
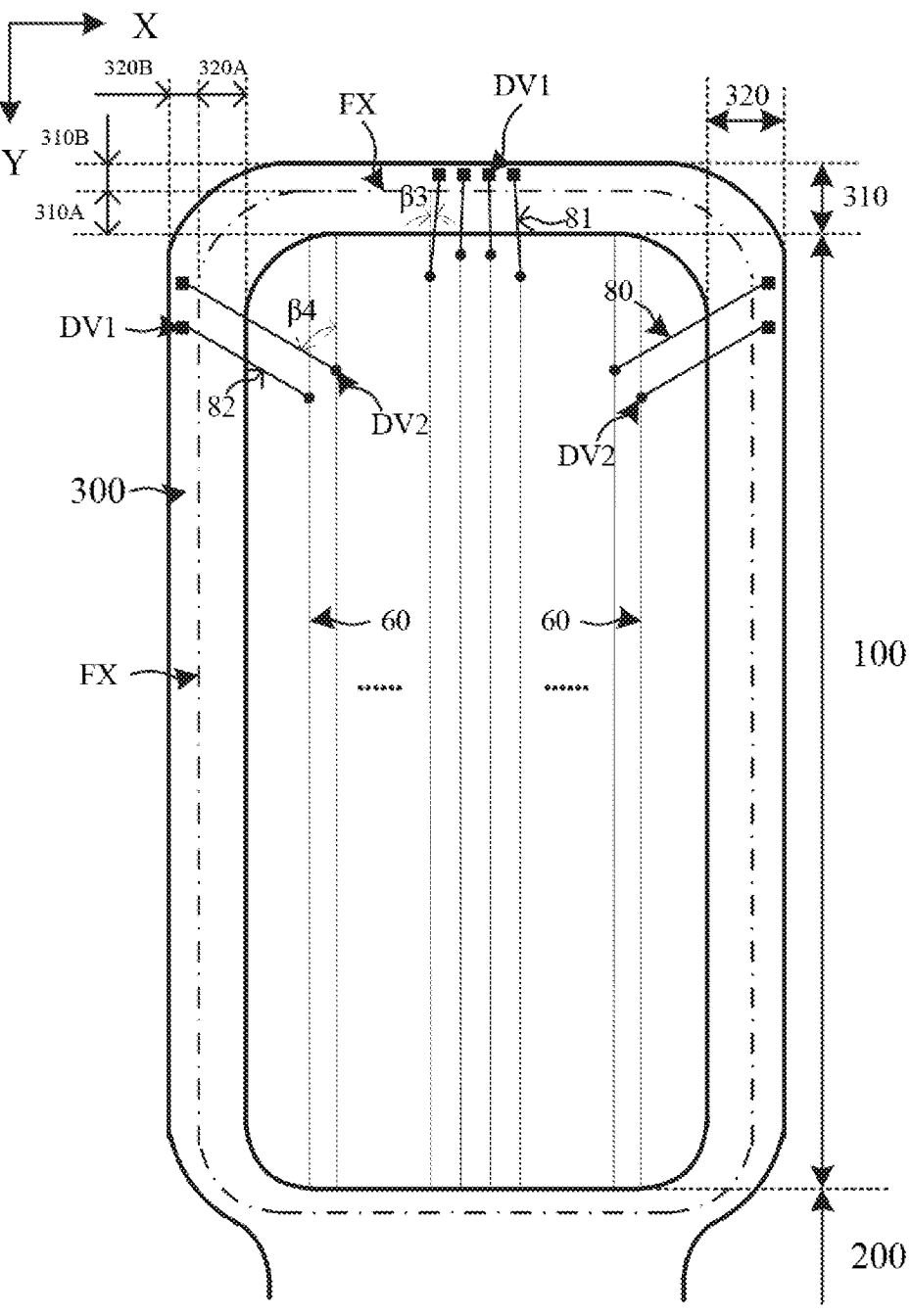

FIG. 6A is a schematic diagram of a planar structure of a display substrate according to an exemplary embodiment of the present disclosure, and data connection lines in the display substrate adopts a FIAA structure. FIG. 6B illustrates a structure of the first connection line in FIG. 6A. FIG. 6C illustrates a structure of the second connection line in FIG. 6A. As shown in FIGS. 6A-6C, on a plane parallel to the display substrate, the display substrate may at least include a display area 100, a bonding area 200 located at a side of the display area 100 in a second direction Y, and a bezel area 300 located at other sides of the display area 100.

In an exemplary implementation, the display area 100 may at least include a plurality of circuit units forming a plurality of unit rows and a plurality of unit columns, the plurality of circuit units sequentially arranged along a first direction X may be referred to as unit rows, and the plurality of circuit units sequentially arranged along the second direction Y may be referred to as unit columns, and the plurality of unit rows and the plurality of unit columns form an array of circuit units arranged in an array, the first direction X intersects the second direction Y. The display area 100 may further include a plurality of data connection lines, the shape of the data signal lines 60 may be a line shape in which the main body portion extends along the second direction Y, and the plurality of data signal lines 60 are sequentially arranged at set intervals in the first direction X. At least one circuit unit may at least include a pixel driving circuit, and each data signal line 60 is connected to the pixel driving circuits of the plurality of circuit units in one unit column. In an exemplary implementation, the second direction Y may be an extension direction (vertical direction) of the data signal line 60, and the first direction X may be perpendicular to the second direction Y (horizontal direction).

In the present disclosure, "A extends along a B direction" means that A may include a main portion and a secondary portion connected with the main portion, the main portion is a line, a line segment, or a strip-shaped body, the main portion extends along the B direction, and a length of the main portion extending along the B direction is greater than a length of the secondary portion extending along another direction. In following description, "A extends along a B direction" means "a main body portion of A extends along a B direction". In an exemplary implementation, the second direction Y may be a direction towards the bonding area from the display area, and an opposite direction of the second direction Y may be a direction towards the display area from the bonding area.

In an exemplary implementation, the bonding area 200 may include at least a lead line area 201 and a bending area 202 sequentially arranged in a direction away from the display area 100, wherein the lead line area 201 may include a plurality of lead lines 220, a first end of the lead lines is connected to an integrated circuit in the bonding area 200, and a second end of the lead lines 220 extends to the lead line area 201 through the bending area 202.

In an exemplary implementation, the bezel area 300 may include an encapsulation area and a non-encapsulation area divided by an encapsulation line FX, the encapsulation line FX may be a boundary of the encapsulation structure layer covering the bezel area 300, and a side of the encapsulation line FX close to the display area 100 is an encapsulation area, a side of the encapsulation line FX away from the display area 100 is a non-encapsulation area, that is, the non-encapsulation area may be located at a side of the encapsulation area away from the display area 100.

In an exemplary implementation, the bezel area 300 may include an upper bezel area 310 located at a side of the display area 100 in an opposite direction of the second direction Y (such as the side of the display area 100 away from the bonding area 200) and a side bezel area 320 located at two sides of the display area 100 in the first direction X. The upper bezel area 310 may include a first encapsulation area 310A and a first non-encapsulation area 310B divided by an encapsulation line FX, the first encapsulation area 310A may be located at a side of the display area 100 away from the bonding area 200 and the first non-encapsulation area 310B may be located at a side of the first encapsulation area 310A away from the display area 100. The side bezel area 320 may include a second encapsulation area 320A and a second non-encapsulation area 320B divided by an encapsulation line FX, the second encapsulation area 320A may be located at two sides of the display area 100 in the first direction X, and the second non-encapsulation area 320B may be located at a side of the second encapsulation area 320A away from the display area 100.

In an exemplary implementation, the display substrate may further include a plurality of first connection lines 70 and second connection lines 80 which form a data connection line. First ends of the plurality of first connection lines 70 are correspondingly connected with the plurality of lead lines 220 of the lead line area 201, and second ends of the plurality of first connection lines 70 extend from the lead line area 201 to the display area 100, then pass through the display area 100 and extend to the bezel area 300, and are correspondingly connected with first ends of the plurality of second connection lines 80 through the first lapping via DV1. Second ends of the plurality of second connection lines 80 extend from the bezel area 300 to the display area 100, then correspondingly connected with a plurality of data signal lines 60 through the second lapping via DV2, thus forming a data connection line structure in which the first lapping via DV1 is provided in the bezel area 300 and the second lapping via DV2 is provided in the display area 100.

In an exemplary implementation, due to the lead line 220 is connected to the integrated circuit in the bonding area 200, the first connection line 70 is connected to the lead line 220, the second connection line 80 is connected to the first connection line 70, and the data signal line 60 is connected to the second connection line 80, so that the data signal line 60 in the display area is connected to the integrated circuit in the bonding area through the second connection line 80, the first connection line 70 and the lead line 220, achieving the integrated circuit providing a data signal to the data signal line 60. Because oblique lines in a fan shape are not needed for the bonding area, the width of the fan-out area is reduced, then the width of the lower bezel may be effectively reduced.

In an exemplary implementation, a quantity of the data connection lines may be equal to a quantity of the data signal lines, or the quantity of the data connection lines may be less than the quantity of the data signal lines, which is not limited in the present disclosure.

In an exemplary implementation, a plurality of first lapping vias DV1 may be respectively provided in the non-encapsulation area of the bezel area 300, i.e. plurality of first lapping vias DV1 are respectively disposed at a side of the encapsulation line FX away from the display area 100.

In an exemplary implementation, a portion of the first lapping vias DV1 may be provided in the first non-encapsulation area 310B of the upper bezel area 310, the other portion of the first lapping vias DV1 may be provided in the second non-encapsulation area 320B of the side bezel area 320.

In an exemplary implementation, a plurality of second lapping vias DV2 may be provided at a side of the display area 100 close to the upper bezel area 310 (i.e., a side of the display area 100 away from the bonding area 200). In the present disclosure, a plurality of second lapping vias DV2 are disposed at an area of the display area 100 close to the upper bezel area 310, so that the extension lengths of the second connection lines 80 are substantially similar, and the resistance of the plurality of data connection lines is substantially similar, and the resistance voltage drops of the plurality of data connection lines have very little difference, which can achieve more uniform screen display and improve the display quality.

In an exemplary implementation, a plurality of first connection lines 70 can be divided into a first connection group and a second connection group depending on the first connection line extends to the upper bezel area 310 or the side bezel area 320. The plurality of first connection lines 70 in the first connection group extend to the upper bezel area 310, and then are correspondingly connected to the plurality of second connection lines 80 through the first lapping vias DV1. The plurality of first connection lines 70 in the second connection group extend to the side bezel area 320, and then are correspondingly connected to the plurality of second connection lines 80 through the first lapping vias DV1.

In an exemplary implementation, the first connection line 70 of the first connection line group may include an extension line 70A and a first sub-line 71 which are connected to each other. The shape of the extension line 70A may be a line shape extending along the second direction Y. A first end of the extension line 70A is connected to the lead line 220 of the lead line area 201, and a second end of the extension line 70A is connected to the first end of the first sub-line 71 after extending from the lead line area 201 to the display area 100. After the second end of the first sub-line 71 extends from the display area 100 to the upper bezel area 310, the second end of the first sub-line 71 is connected to the first end of the second connection line 80 through the first lapping via DV1.

In an exemplary implementation, there is a first included angle β1 between the first sub-line 71 and the second direction Y, and the first included angle β1 may be less than or equal to 30°.

In an exemplary implementation, the first included angle β1 may be about 0°, i.e. the shape of the first sub-line 71 is a line shape extending along the second direction Y, the extension line 70A and the first sub-line 71 are both parallel to the data signal line 60.

In an exemplary implementation, the first connection line 70 of the second connection line group may include an extension line 70A and a second sub-line 72 which are connected to each other. The shape of the extension line 70A may be a line shape extending along the second direction Y. A first end of the extension line 70A is connected to the lead line 220 of the lead line area 201, and a second end of the extension line 70A is connected to the first end of the second sub-line 72 after extending from the lead line area 201 to the display area 100. After the second end of the second sub-line 72 extends from the display area 100 to the side bezel area 320, the second end of the second sub-line 72 is connected to the first end of the second connection line 80 through the first lapping via DV1.

In an exemplary implementation, there is a second included angle β2 between the second sub-line 72 and the second directions Y, and the second included angle β2 may be greater than or equal to 60° and less than or equal to 90°.

In an exemplary implementation, the second included angle β2 may be about 90°, i.e. the shape of the second sub-line 72 is a line shape extending along the first direction X, the extension line 70A is parallel to the data signal line 60 and the second sub-line 72 is perpendicular to the data signal line 60.

In an exemplary implementation, an extension length of the extension line 70A may be greater than or equal to a result of 0.5 being multiplied a length of the display area, and the extension length may be a dimension of the extension line 70 in the second direction Y, the length of the display area can be a dimension of the display area in the second direction Y.

In an exemplary implementation, a plurality of second connection lines 80 can be divided into a third connection line group and a fourth connection line group depending on whether the second connection line 80 extends to the display area 100 from the upper bezel area 310 or to the display area 100 from the side bezel area 320. A plurality of second connection lines 80 of the third connection group extend from the upper bezel area 310 to the display area 100, and then are correspondingly connected to a plurality of data signal lines 60 through the second lapping via DV2. A plurality of second connection lines 80 of the fourth connection group extend from the side bezel area 320 to the display area 100, and then are correspondingly connected to a plurality of data signal lines 60 through the second lapping via DV2.

In an exemplary implementation, the third connection line group may include a plurality of third sub-lines 81, first ends of the plurality of third sub-lines 81 are correspondingly connected to the first sub-lines 71 of the plurality of first connection lines 70 through the first lapping vias DV1 in the upper bezel area 310, and second ends of the plurality of third sub-lines 81 are correspondingly connected to the plurality of data signal lines 60 through the second lapping vias DV2 after extending to the display area 100.

In an exemplary implementation, there is a third included angle β3 between the third sub-line 81 and the second directions Y, and the third included angle β3 may be equal to the first included angle β1.

In an exemplary implementation, the third included angle β3 may be about 0°, i.e. the shape of the third sub-line 81 is a line shape extending along the second direction Y, the third sub-line 81 is parallel to the data signal line 60.

In an exemplary implementation, the fourth connection line group may include a plurality of fourth sub-lines 82, first ends of the plurality of fourth sub-lines 82 are correspondingly connected to the second sub-lines 72 of the plurality of first connection lines 70 through the first lapping vias DV1 in the side bezel area 320, and second ends of the plurality of fourth sub-lines 82 are correspondingly connected to the plurality of data signal lines 60 through the second lapping vias DV2 after extending to the display area 100.

In an exemplary implementation, there is a fourth included angle β4 between the fourth sub-line 82 and the second directions Y, and the fourth included angle β4 may be equal to the second included angle β2.

In an exemplary implementation, the fourth included angle β4 may be about 90°, i.e. the shape of the fourth sub-line 82 is a line shape extending along the first direction X, the fourth sub-line 82 is perpendicular to the data signal line 60.

In an exemplary implementation, the orthographic projection of the first sub-line 71 on the display substrate plane is at least partially overlapped with an orthographic projection of the third sub-line 81 on the display substrate plane, and an orthographic projection of the second sub-line 72 on the display substrate plane is at least partially overlapped with an orthographic projection of the fourth sub-line 82 on the display substrate plane.

In an exemplary implementation, in the upper bezel area 310, an orthographic projection of the third sub-line 81 on the display substrate plane may be within a range of an orthographic projection of the first sub-line 71 on the display substrate. In the side bezel area 320, an orthographic projection of the fourth sub-line 82 on the display substrate plane may be within a range of an orthographic projection of the second sub-line 72 on the display substrate plane. Therefore, a stacked line structure of the first connection line 70 and the second connection line 80 is formed, so as to reduce the integrated capacitance for transmitting the data signal.

In an exemplary implementation, on a plane parallel to the display substrate, the shape of the first lapping via DV1 may include any one or more of the following: triangle, rectangle, pentagon, hexagon, circle and ellipse.

In an exemplary implementation, on a plane parallel to the display substrate, the shape of the second lapping via DV2 may include any one or more of the following: triangle, rectangle, pentagon, hexagon, circle and ellipse.

In an exemplary implementation, on a plane perpendicular to the display substrate, the display substrate may include a base substrate and a driving circuit layer disposed on the base substrate. The base substrate may at least include a first connection line 70, the driver circuit layer may at least include a data signal line 60 and a second connection line 80, the first connection line 70 is connected to the second connection line 80 through a first lapping via DV1 located in the bezel area, and the second connection line 80 is connected to the data signal line 60 through a second lapping via DV2 located in the display area.

In an exemplary implementation, the base substrate may at least include a first flexible layer, a second flexible layer, and a base substrate conductive layer (SD0) disposed between the first flexible layer and the second flexible layer, the first connection line 70 may be provided in the base substrate conductive layer.

In an exemplary implementation, the pixel driving circuit in the circuit unit may include a storage capacitor and a plurality of transistors. The driving circuit layer may include at least a first conductive layer, a second conductive layer, and a third conductive layer arranged in sequence in a direction away from the base substrate, a first plate of the storage capacitor may be provided in the first conductive layer (GATE1), the second connection line 80 and a second plate of the storage capacitor may be provided in the second conductive layer (GATE2), the second connection line 80 is connected to the first connection line 70 through the first lapping via DV1, and the data signal line 60 is provided in the third conductive layer (SD1), the data signal line 60 is connected to the second connection line 80 through the second lapping via DV2.

Figure 7A:
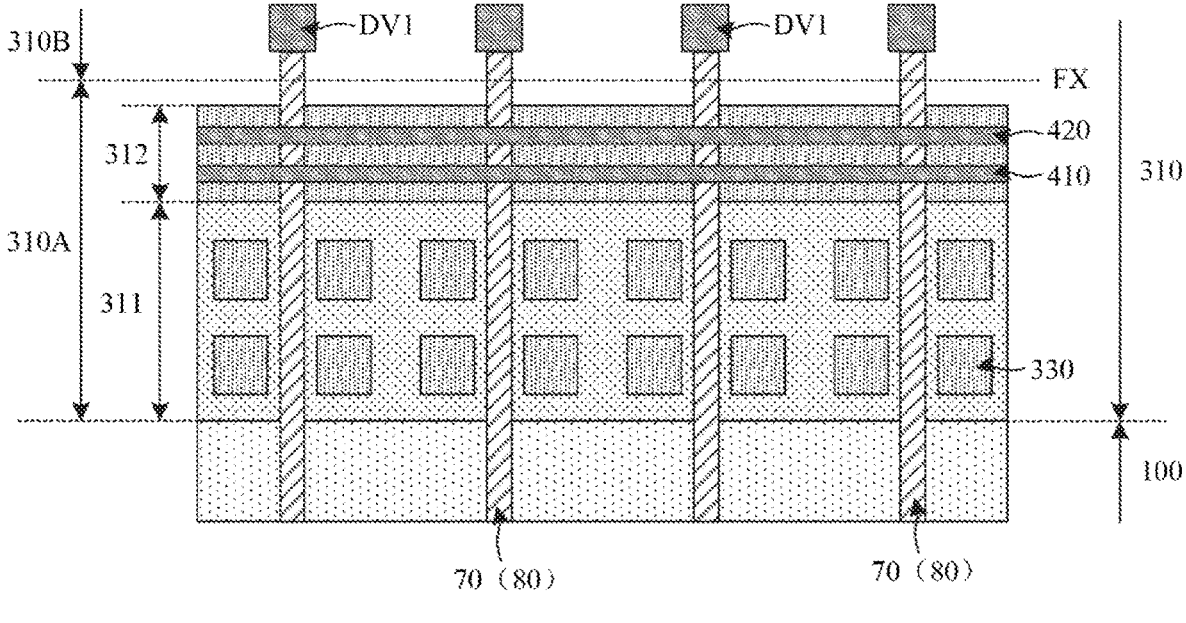
FIG. 7A to FIG. 7D are schematic diagrams of a structure of a bezel area according to an exemplary embodiment of the present disclosure.

FIG. 7A is a schematic diagram of a structure of an upper bezel area according an exemplary embodiment of the present disclosure, which is an enlarged view of area A in FIG. 6A. As shown in FIGS. 6A and 7A, on a plane parallel to the display substrate, an upper bezel area 310 of the bezel area 300 may be located at a side of the display area 100 away from the bonding area, and the upper bezel area 310 may include a first encapsulation area 310A and a first non-encapsulation area 310B divided by a encapsulation line FX, the encapsulation line FX may be a boundary of an encapsulation structure layer covering the upper bezel area 310. A side of the encapsulation line FX close to the display area 100 is the first encapsulation area 310A, and a side of the encapsulation line FX away from the display area 100 is the first non-encapsulation area 310B.

In an exemplary implementation, the first encapsulation area 310A may at least include an electrostatic circuit area 311 and a first isolation dam area 312 sequentially arranged in a direction away from the display area.

In an exemplary implementation, the electrostatic circuit area 311 may be provided with a plurality of Electrostatic Discharge (ESD) circuits 330 that may be sequentially arranged along a direction parallel to an edge of the display area. Each electrostatic discharge circuit 330 may at least include an electrostatic transistor and an electrostatic capacitor. Typically, the electrostatic transistor and electrostatic capacitor in the electrostatic discharge circuit 330 are prepared synchronously with the transistor and storage capacitor in the pixel driving circuit in the display area.

In an exemplary implementation, the first isolation dam area 312 may be provided with a first isolation dam 410 and a second isolation dam 420 that may extend in a direction parallel to the edge of the display area and are connected to the first isolation dam and the second isolation dam of the side bezel area to form an annular structure around the display area, the edge of the display area is an edge of the display area at a side close to the upper bezel area. Typically, the first isolation dam 410 and the second isolation dam 420 are prepared synchronously with the light emitting structure layer in the display area.

In an exemplary implementation, the first non-encapsulation area 310B may at least include a crack dam area and a cutting area that are arranged in sequence in a direction away from the display area. The crack dam area may be connected to the first isolation dam area 312 and may at least include a plurality of cracks provided on the composite insulation layer to form a crack dam, the crack dam is configured to reduce stress on the display area during cutting and cut off the propagation of cracks towards the display area. The cutting area may be connected to the crack dam area and may at least include a cutting groove disposed on the composite insulation layer, and the cutting groove is used for cutting respectively along the cutting groove by a cutting device after all film layers of the display substrate are prepared.

In an exemplary implementation, a plurality of first lapping vias DV1 may be provided in the first non-encapsulation area 310B. In some exemplary embodiments, a plurality of first lapping vias DV1 may be provided between the second isolation dam and the crack dam of the upper bezel area 310.

In an exemplary implementation, a plurality of first connection lines 70 extend from the display area 100 to the upper bezel area 310 and then sequentially passes through the electrostatic circuit area 311 and the first isolation dam area 312, and the plurality of first connection lines 70 are connected to the second connection lines 80 through the first lapping vias DV1 in the first non-encapsulation area 310B. The second connection lines 80 are connected to the data signal line through the second lapping vias (not shown) after sequentially passing through the first isolation dam area 312 and the electrostatic circuit area 311 and extending to the display area 100.

In an exemplary implementation, in the upper bezel area 310, an orthographic projection of the first connection line 70 on the base substrate is at least partially overlapped with an orthographic projection of the second connection line 80 on the base substrate.

In an exemplary implementation, in the upper bezel area 310, an orthographic projection of the second connection line 80 on the base substrate may be within a range of an orthographic projection of the first connection line 70 on the base substrate, thus forming a stacked line structure of the first connection line 70 and the second connection line 80.

In an exemplary implementation, there is a first spacing between the electrostatic discharge circuits 330 adjacent to each other in the first direction X, the first connection line 70 and the second connection line 80 are both disposed in an area where the first spacing is located, and the orthographic projections of the first connection line 70 and the second connection line 80 on the base substrate are not overlapped with the orthographic projections of the electrostatic transistor and the electrostatic capacitor on the base substrate, so that the first connection line 70 and the second connection line 80 avoid the electrostatic transistor and the electrostatic capacitor of the electrostatic discharge circuit 330. Because the first connection line 70 is located in the base substrate conductive layer, if the electrostatic transistor and the electrostatic capacitor are overlapped with the first connection line 70, the first connection line 70 located below the electrostatic transistor and the electrostatic capacitor causes a change in a thickness of a dielectric layer between the electrostatic transistor and the electrostatic capacitor, thereby causing a change in electrical characteristics. In the present disclosure, by arranging a positional relationship between the first connection line and the electrostatic discharge circuit, the working stability and reliability of the electrostatic discharge circuit is ensured.

Figure 7B:
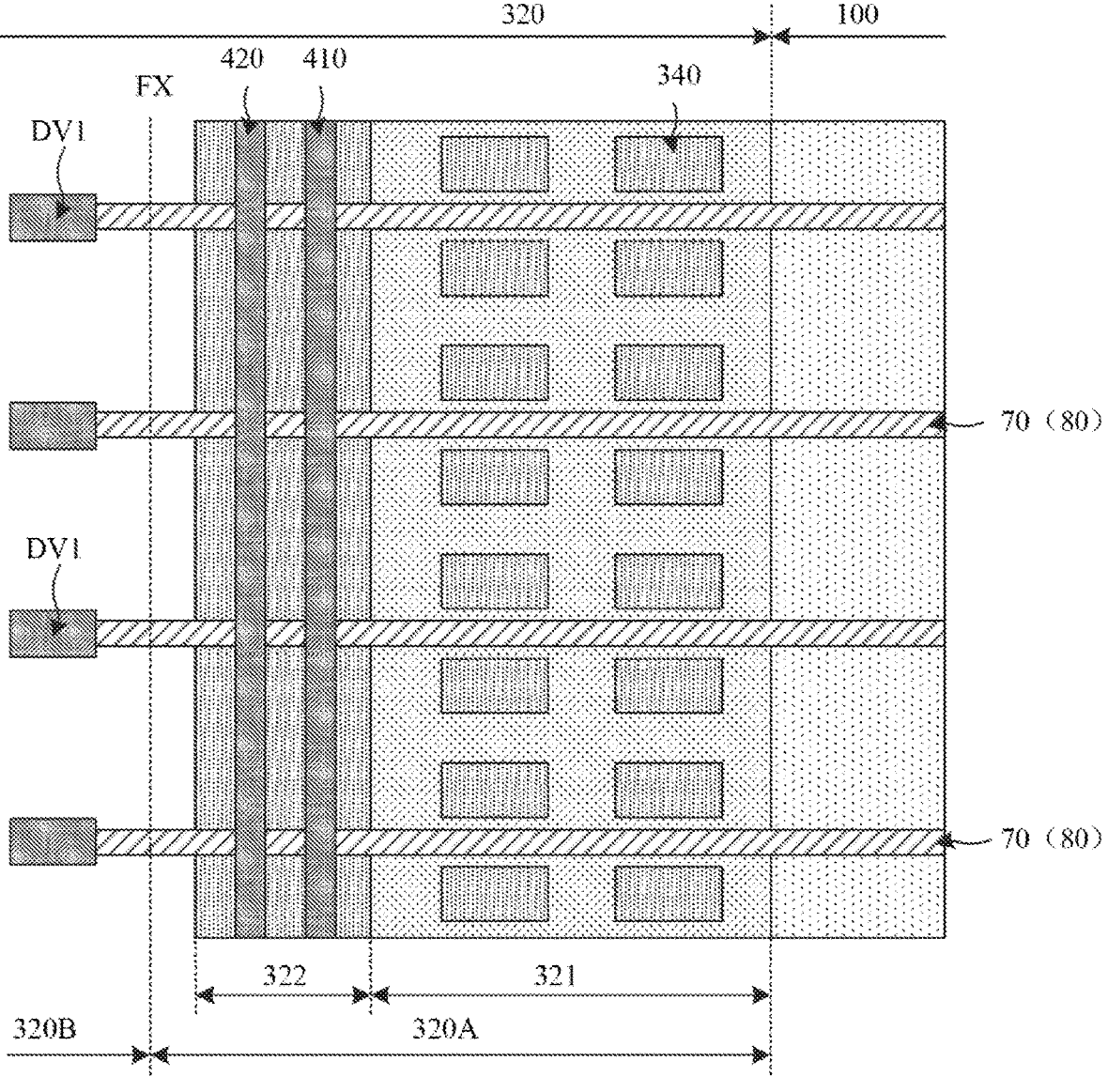

FIG. 7B is a schematic diagram of a structure of a side bezel area according an exemplary embodiment of the present disclosure, which is an enlarged view of area B in FIG. 6A. As shown in FIGS. 6A and 7B, on a plane parallel to the display substrate, a side bezel area 320 of the bezel area 300 may be located at one side or two sides of the display area 100 in the first direction X, and the side bezel area 320 may include a second encapsulation area 320A and a second non-encapsulation area 320B divided by an encapsulation line FX, the encapsulation line FX may be a boundary of an encapsulation structure layer covering the side bezel area 320. A side of the encapsulation line FX close to the display area 100 is the second encapsulation area 320A, and a side of the encapsulation line FX away from the display area 100 is the second non-encapsulation area 320B.

In an exemplary implementation, the second encapsulation area 320A may at least include a gate circuit area 321 and a second isolation dam area 322 sequentially arranged in a direction away from the display area.

In an exemplary implementation, the gate circuit area 321 may be provided with a plurality of array substrate row driving (such as Gate On Array (GOA)) circuits 340 which may be sequentially arranged in a direction parallel to the edge of the display area. Each row driving circuit 340 may at least include a row driving transistor and a row driving capacitor. Typically, the row driving transistor and the row driving capacitor in the row driving circuit 340 are prepared in synchronization with the transistor and the storage capacitor in the pixel driving circuit in the display area.

In an exemplary implementation, the second isolation dam area 322 may be provided with a first isolation dam 410 and a second isolation dam 420 that may extend in a direction parallel to the edge of the display area and are connected to the first isolation dam and the second isolation dam of the upper bezel area to form an annular structure around the display area.

In an exemplary implementation, the second non-encapsulation area 320B may at least include a crack dam area and a cutting area that are arranged sequentially in a direction away from the display area, and the structure of the crack dam area and the cutting area of the side bezel area 320 and the crack dam area and the cutting area of the upper bezel area 310 may be substantially the same.

In an exemplary implementation, a plurality of first lapping vias DV1 may be provided in the second non-encapsulation area 320B. In some exemplary embodiments, a plurality of first lapping vias DV1 may be provided between the second isolation dam and the crack dam of the side bezel area 320.

In an exemplary implementation, a plurality of first connection lines 70 extend from the display area 100 to the side bezel area 320 and then sequentially passes through the gate circuit area 311 and the second isolation dam area 312, and the plurality of first connection lines 70 are connected to the second connection lines 80 through the first lapping vias DV1 in the second non-encapsulation area 320B. The second connection lines 80 are connected to the data signal line through the second lapping vias (not shown) after sequentially passing through the second isolation dam area 312 and the gate circuit area 311 and extending to the display area 100.

In an exemplary implementation, in the side bezel area 320, an orthographic projection of the first connection line 70 on the base substrate is at least partially overlapped with an orthographic projection of the second connection line 80 on the base substrate.

In an exemplary implementation, in the side bezel area 320, an orthographic projection of the second connection line 80 on the base substrate may be within a range of an orthographic projection of the first connection line 70 on the base substrate, thus forming a stacked line structure of the first connection line 70 and the second connection line 80.

In an exemplary implementation, there is a second spacing between the row driving circuits 340 adjacent in the second direction Y, the first connection lines 70 and the second connection lines 80 are both disposed in the area where the second spacing is located, and the orthographic projection of the first connection line 70 and the second connection line 80 on the base substrate are not overlapped with the orthographic projections of the row driving transistor and the row driving capacitor on the base substrate, so that the first connection line 70 and the second connection line 80 can avoid the row driving transistor and the row driving capacitor of the row driving circuit 340. Because the first connection line 70 is located in the base substrate conductive layer, if the row driving transistor and the row driving capacitor are overlapped with the first connection line 70, the first connection line 70 located below the row driving transistor and the row driving capacitor causes a change in the thickness of a dielectric layer between the row driving transistor and the row driving capacitor, thereby causing a change in electrical characteristics. In the present disclosure, by arranging a positional relationship between the first connection line and the row driving circuit, the working stability and reliability of the row driving circuit is ensured.

Figure 7C:
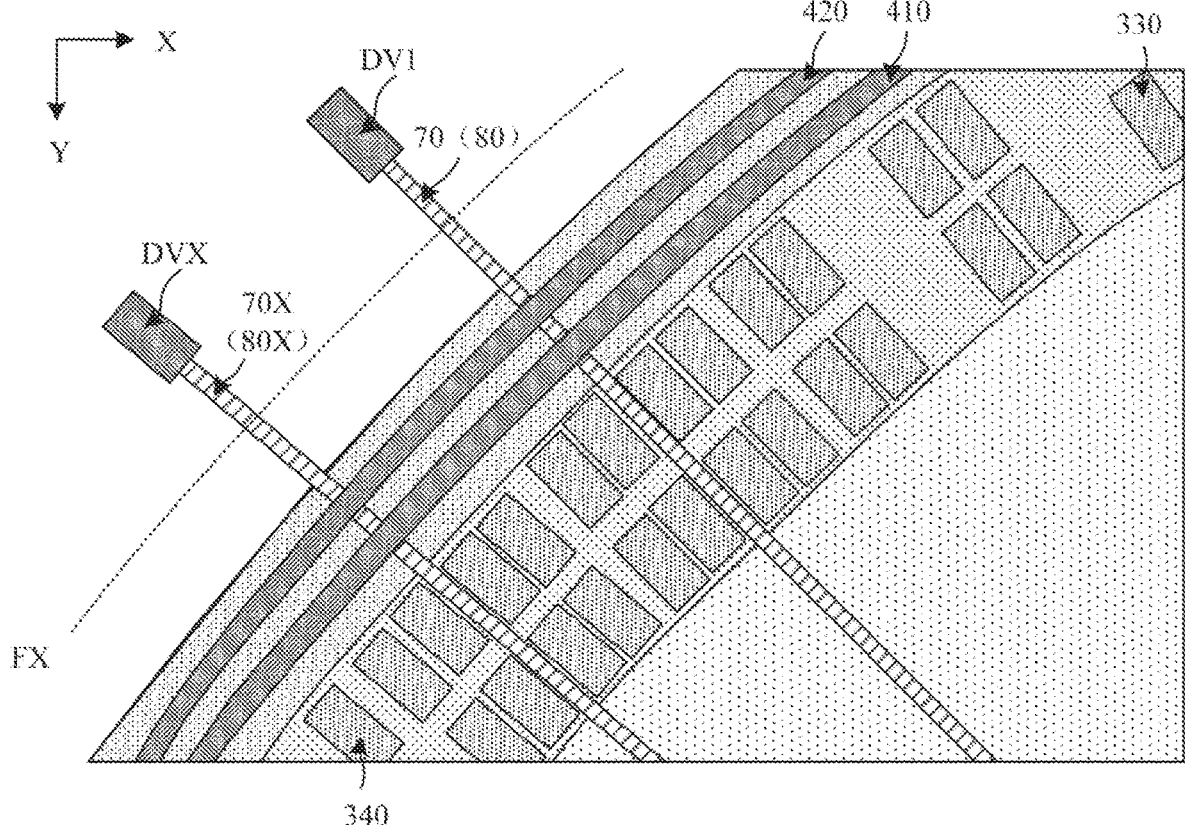

FIG. 7C is a schematic diagram of a structure of a bezel corner according to an exemplary embodiment of the present disclosure, which is an enlarged view of area C in FIG. 6A. As shown in FIGS. 6A and 7C, on a plane parallel to the display substrate, the bezel corner of the bezel area 300 may be located at a junction area of the upper bezel area 310 and the side bezel area 320, and the bezel corner may include an encapsulation area and a non-encapsulation area divided by a encapsulated line FX, the encapsulation area may at least include a circuit area and an isolation dam area arranged in sequence in a direction away from the display area.

In an exemplary implementation, the circuit area may be provided with a plurality of electrostatic discharge circuits 330 or row driving circuits 340, the isolation dam area may be provided with a first isolation dam 410 and a second isolation dam 420, and the non-encapsulated area may include a crack dam area and a cutting area arranged in sequence in a direction away from the display area.

In an exemplary implementation, the bezel corner may be provided with at least one first lapping via DV1 and at least one first connection line 70 and a second connection line 80. The first connection line 70 is connected with the second connection line 80 through the first lapping via DV1 after extending from the display area to the bezel corner and the second connection line 80 is connected with the data signal line through the second lapping via after extending from the bezel corner to the display area. An orthographic projection of the first connection line 70 on the base substrate and an orthographic projection of the second connection line 80 on the base substrate are at least partially overlapped to form a stacked line structure of the first connection line 70 and the second connection line 80.

In the exemplary embodiment, there is a spacing between adjacent electrostatic discharge circuits 330 or adjacent row driving circuits 340, and the first connection line 70 and the second connection line 80 are both disposed in an area where the spacing is located, so that the first connection line 70 and the second connection line 80 can avoid the electrostatic discharge circuit 330 or the row driving circuit 340, and the operation stability and reliability of the electrostatic discharge circuit 330 or the row driving circuit 340 are ensured.

In an exemplary implementation, the bezel corner may further be provided with at least one dummy lapping via DVX and at least one first dummy line 70X and a second dummy line 80X. After the first dummy line 70X extends from the display area to the bezel corner, the first dummy line 70X is connected to the second dummy line 80X through the dummy lapping via DVX, and the second dummy line 80X extends to the display area from the bezel corner and is not connected to the data signal line.

In an exemplary implementation, the structure of the dummy lapping via DVX and the structure of the first lapping via DV1 may be substantially the same, the structure of the first dummy line 70X and the structure of the first connection line 70 may be substantially the same, and the structure of the second dummy line 80X and the structure of the second connection line 80 may be substantially the same, wherein an orthographic projection of the first dummy line 70X on the base substrate is at least partially overlapped with an orthographic projection of the second dummy line 80X on the base substrate.

In the exemplary embodiment, because the shape of the bezel corner is irregular, the quantity of electrostatic discharge circuits 330 or row driving circuits 340 provided is relatively small, and the quantity of first connection lines 70 and second connection lines 80 provided is relatively small, so the number of first lapping vias provided in the bezel corner is relatively small. From the bezel corner to the upper bezel area 310, the first lapping vias gradually become dense from sparse and are uniformly arranged on the upper bezel area 310. From the bezel corner to the side bezel area 320, the first lapping vias gradually become dense from sparse and are uniformly arranged on the side bezel area 320. In the present disclosure, by providing the dummy lapping via DVX in the area of the bezel corner, so that the etching uniformity of the lapping via in the bezel area can be ensured, the etching quality of the lapping via is improved and the connection reliability is ensured. In the present disclosure, by providing the first dummy line 70X and the second dummy line 80X in the area of the bezel corner, so that the etching uniformity of the connection line in the bezel area can be ensured, the etching quality of the connection line can be improved, and the connection reliability can be ensured.

Figure 7D:
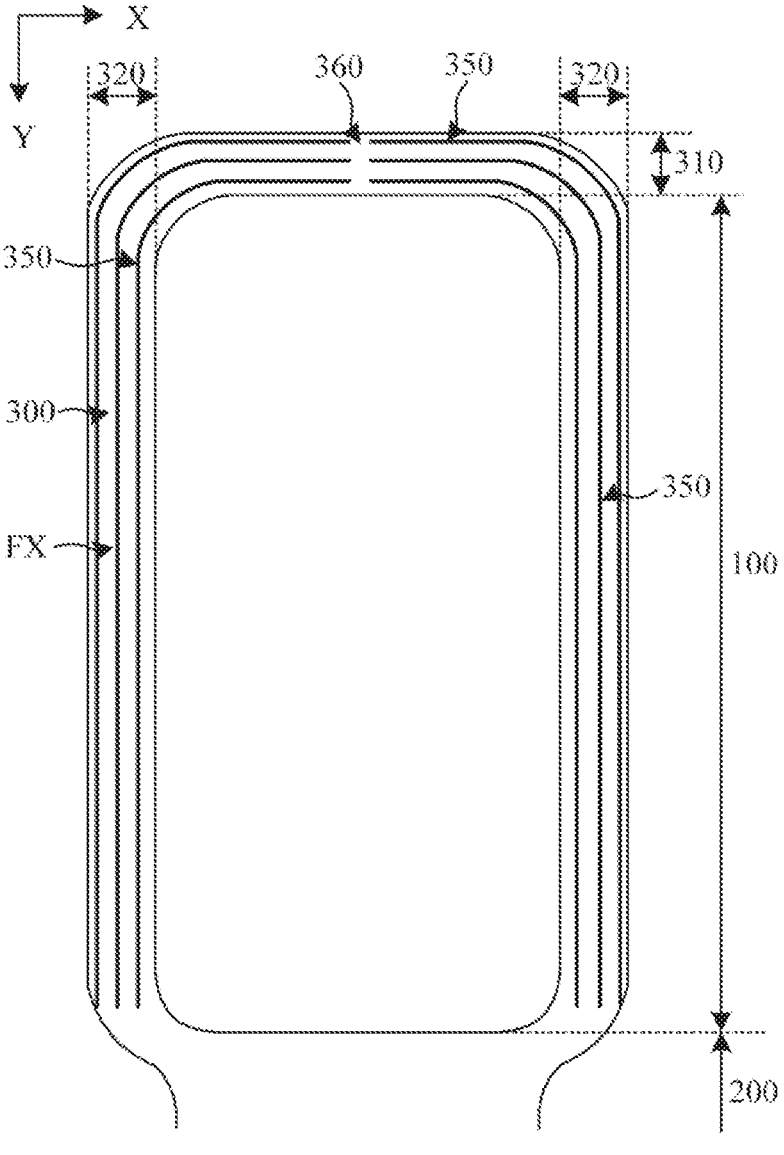

FIG. 7D is a schematic diagram of a structure of a clock signal line according to an exemplary embodiment of the present disclosure. As shown in FIGS. 7B and 7D, a plurality of row driving circuits 340 in the side bezel area 320 are connected with a plurality of clock signals (GOA Clock) line 350 and the clock signal line 350 is configured to output a clock signal to each row driving circuit 340 so that the row driving circuit 340 outputs a scan signal in accordance with the received clock signal.

In an exemplary implementation, the clock signal lines 350 in the exemplary embodiment of the present disclosure are disposed in the upper bezel area 310 and the side bezel area 320, respectively. The clock signal lines 350 in the upper bezel area 310 and the side bezel area 320 may be in a shape of a line extending along a direction parallel to the edge of the display area. In the upper bezel area 310, a plurality of clock signal lines 350 may extend along the first direction X, in the side bezel area 320, a plurality of clock signal lines 350 may extend along the second direction Y, and the clock signal lines 350 of the upper bezel area 310 and the clock signal lines 350 of the side bezel area 320 may be connected to each other to form an integrated structure.

In an exemplary implementation, the plurality of clock signal lines 350 in the upper bezel area 310 may be provided with a fracture 360 which cuts off the plurality of clock signal lines 350, i.e. the clock signal lines 350 on two sides of the fracture 360 are not communicated. Typically, the plurality of clock signal lines 350 and a fracture 360 can be prepared synchronously with the plurality of scan signal lines in the display area, and clock signals from the bonding area are transmitted upward from the left and right sides, and then continue to be transmitted to the middle after reaching the top, and the clock signals on both sides of the middle of the upper bezel area 310 are disconnected.

In an exemplary implementation, because the plurality of first connection lines 70 (second connection lines 80) of the side bezel area 320 are in a shape of a line extending transversely and the plurality of clock signal lines 350 are in a shape of a line extending vertically, the plurality of first connection lines 70 (second connection lines 80) pass under the plurality of clock signal lines 350, and the orthographic projection of the first connection lines 70 (second connection lines 80) on the base substrate is at least partially overlapped with the orthographic projection of an clock signal lines 350 on the base substrate. Research shows that because there is an integrated capacitance between the first connection line 70 (second connection line 80) and the clock signal line 350 in the side bezel area 320, the clock signal transmitted by the clock signal line 350 affects the data signal transmitted by the first connection line 70 (second connection line 80).

In an exemplary implementation of the present disclosure, a clock signal line 350 is provided in the upper bezel area 310, because a plurality of first connection lines 70 (second connection lines 80) of the upper bezel area 310 are in a shape of a line extending vertically and a plurality of clock signal lines 350 are in a shape of a line extending transversely, the plurality of first connection lines 70 (second connection lines 80) pass under the plurality of clock signal lines 350, and the orthographic projection of the first connection lines 70 (second connection lines 80) on the base substrate is at least partially overlapped with the orthographic projection of the clock signal lines 350 on the base substrate, so that an integrated capacitance also exists between the first connection lines 70 (second connection lines 80) of the upper bezel area 310 and the clock signal lines 350. Thus, because the integrated capacitance exists in both the upper bezel area 310 and the side bezel area 320, the environment and integrated capacitance of the upper bezel area 310 coincide with those of the side bezel area 320, therefore the uniformity of the signal transmitted by the first connection line 70 (the second connection line 80) can be ensured. Compared with the existing structure in which the clock signal line 350 is provided only in the side bezel area 320, the data signal transmission uniformity and the display effect are improved in the present disclosure.

Figure 8:
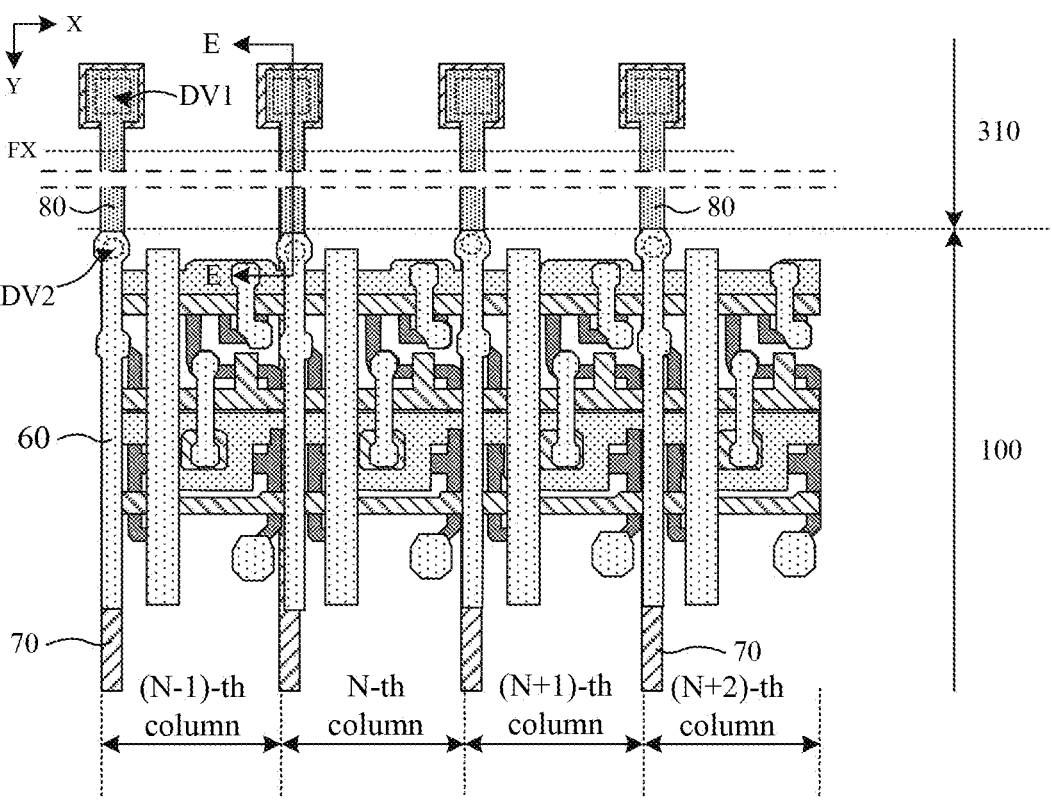
FIG. 8 is a schematic diagram of a planar structure of a data connection line according to an exemplary embodiment of the present disclosure.

FIG. 8 is a schematic diagram of a planar structure of a data connection line according to an exemplary embodiment of the present disclosure, which illustrates the structure of the data connection line of a display area and an upper bezel area. As shown in FIG. 8, on a plane parallel to the display substrate, the display area 100 may include a plurality of circuit units forming a plurality of unit rows and a plurality of unit columns, at least one circuit unit may include a pixel driving circuit, the pixel driving circuit may at least include a plurality of transistors and a storage capacitor, and a data signal line 60 is connected to a plurality of pixel driving circuits of one unit column, and the data signal line 60 is configured to supply a data signal to the pixel driving circuit.

In an exemplary implementation, the first connection line 70 and the second connection line 80 may be disposed in the display area 100 and the upper bezel area 310, the first lapping via DV1 connecting the first connection line 70 and the second connection line 80 may be provided in the upper bezel area 310, and the first lapping via DV1 may be provided at a side of the encapsulation line FX away from the display area 100, and the second lapping via DV2 connecting the second connection line 80 and the data signal line 60 may be provided in the display area 100.

In the exemplary embodiment, the first connection line 70 is connected to the second connection line 80 through the first lapping via DV1 after extending from the display area 100 to the upper bezel area 310, and the second connection line 80 is connected to the data signal line 60 through the second lapping via DV2 after extending from the upper bezel area 310 to the display area 100.

Figure 9:
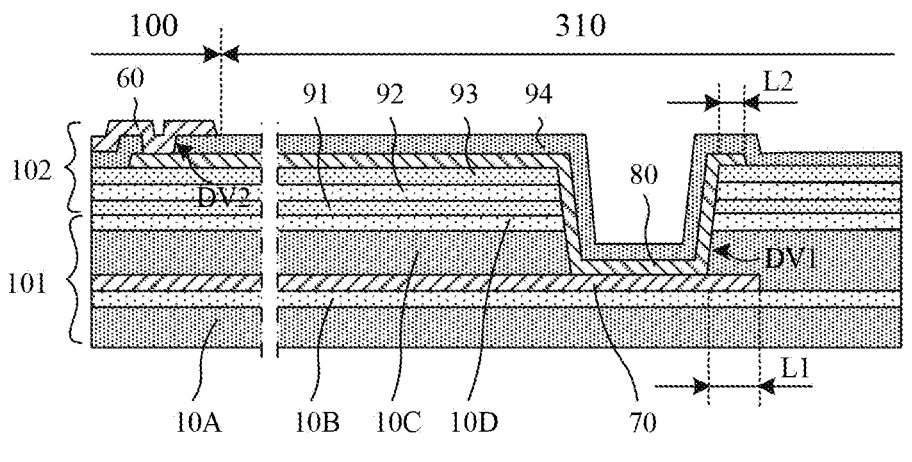
FIG. 9 is a schematic diagram of a cross-sectional structure of a data connection line according to an exemplary embodiment of the present disclosure.

FIG. 9 is a schematic diagram of a cross-sectional structure of a data connection line according to an exemplary embodiment of the present disclosure, which is a cross-sectional view taken along the line E-E in FIG. 8. As shown in FIG. 9, on a plane perpendicular to the display substrate, the display substrate may at least include a driving circuit layer 102 disposed on the base substrate 101. In an exemplary implementation, the base substrate 101 may at least include a first flexible layer 10A, a second flexible layer 10C, and a base substrate conductive layer disposed between the first flexible layer 10A and the second flexible layer 10C, and the base substrate conductive layer may at least include a first connection line 70. The driving circuit layer 102 may at least include a data signal line 60 and a second connection line 80, the data signal line 60 is connected to the second connection line 80 through the second lapping via DV2, and the second connection line 80 is connected to the first connection line 70 through the first lapping via DV1.

In an exemplary implementation, the driving circuit layer 102 may at least include a first insulation layer 91, a semiconductor layer, a second insulation layer 92, a first conductive layer, a third insulation layer 93, a second conductive layer, a fourth insulation layer 94 and a third conductive layer stacked in sequence on the base substrate 101. The semiconductor layer may at least include active layers of a plurality of transistors of the pixel driving circuit, the first conductive layer may at least include gate electrodes of the plurality of transistors and a first plate of the storage capacitor, the second conductive layer may at least include the second connection line 80 and a second plate of the storage capacitor, and the third conductive layer may at least include the data signal line 60 and first electrodes and second electrodes of the plurality of transistors.

In an exemplary implementation, the base substrate 101 may further include a first barrier layer 10B and a second barrier layer 10D. The first barrier layer 10B is disposed between the first flexible layer 10A and a base substrate conductive layer, and the second barrier layer 10D is disposed at a side of the second flexible layer 10C away from the first flexible layer 10A.

In an exemplary implementation, a first width L1 between an edge of the first lapping via DV1 and an edge of the first connection line 70 may be greater than or equal to 2.5 μm, and the first width L1 may be a dimension in a direction away from the first lapping via DV1.

In an exemplary implementation, the second connection line 80 covers the first connection line 70 exposed by the bottom inside the first lapping via DV1 and covers the flexible layer and a plurality of inorganic layers exposed by an inner wall inside the first lapping via DV1, and the second connection line 80 covers the third insulation layer outside the first lapping via DV1.

In an exemplary implementation, a second width L2 of the third insulation layer outside the first lapping via DV1 covered by the second connection line 80 may be greater than or equal to 2.5 μm, and the second width L2 may be a dimension in a direction away from the first lapping via DV1.

Exemplary description is made below through a manufacturing process for a display substrate. A "patterning process" mentioned in the present disclosure includes coating with a photoresist, a mask exposure, a development, etching, photoresist stripping, and other treatments for a metal material, an inorganic material, or a transparent conductive material, or includes coating with an organic material, a mask exposure, a development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in the present disclosure. A "thin film" refers to a layer of thin film made of a material on a base substrate using a process such as deposition, coating or other process. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B are disposed on the same layer" in the present disclosure means that A and B are formed simultaneously through the same running of the patterning processes, and the "thickness" of the film layer is the size of the film layer in a direction perpendicular to the display substrate. In an exemplary implementation of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the ortho-graphic projection of A is overlapped with the boundary of the orthographic projection of B.

In an exemplary implementation, a manufacturing process for a display substrate according to the exemplary embodiment may include following operations.

Figures 10, 11:
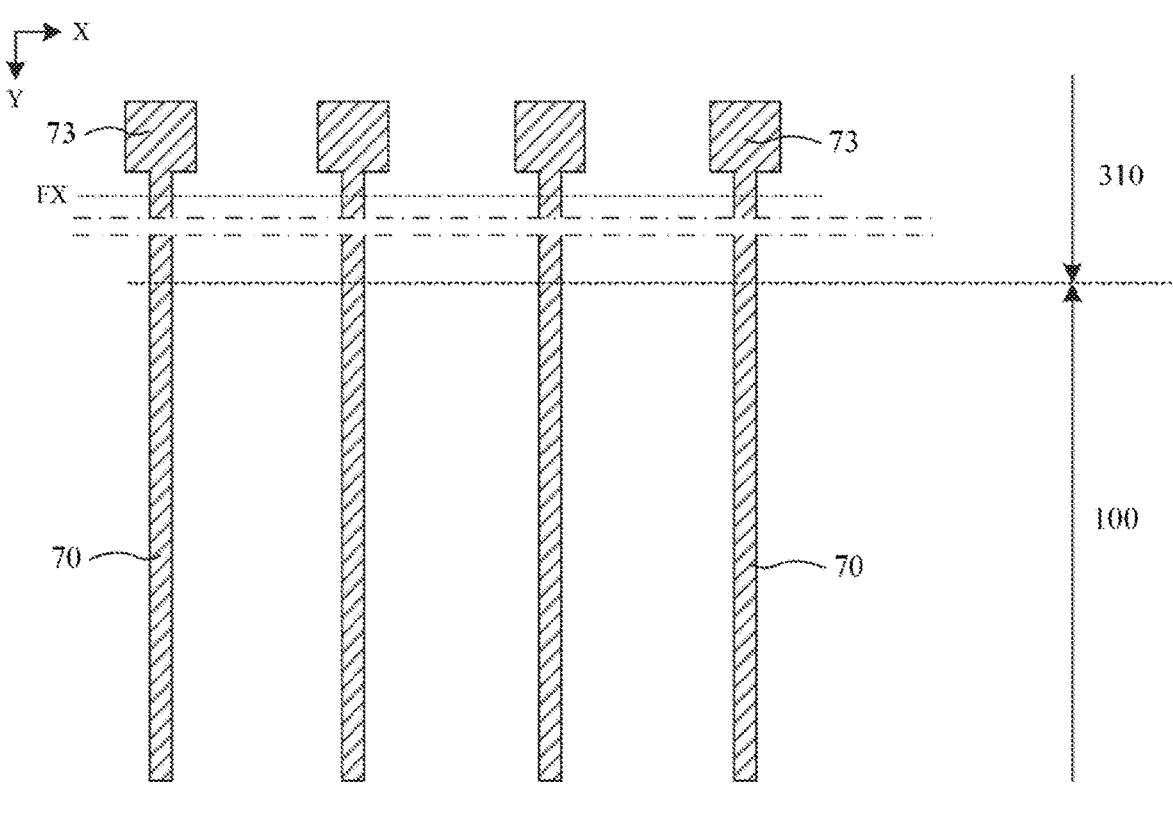
FIG. 10 is a schematic diagram of a display substrate after a base substrate is formed according to an embodiment of the present disclosure.
FIG. 11 is a schematic diagram of a display substrate after a semiconductor layer is formed according to an embodiment of the present disclosure.

(1) A base substrate is manufactured. In an exemplary implementation, manufacturing a base substrate may include: on a glass carrier plate, a layer of a first flexible material is coated at first, which is cured into film to form a first flexible layer 10A. Then a block thin film and a base substrate conductive film are sequentially deposited on the first flexible layer 10A, and the base substrate conductive film is patterned by a patterning process to form a first barrier layer covering the first flexible layer and a pattern of the base substrate conductive layer disposed on the first barrier layer. A layer of second flexible material is then coated and cured into film to form a second flexible layer covering the pattern of the base substrate conductive layer. Then, a second barrier thin film is deposited to form a second barrier layer covering the second flexible layer, as shown at FIG. 10. In an exemplary implementation, the base substrate conductive layer may be referred to as a 0th source drain metal (SD0) layer.

In an exemplary implementation, the pattern of the base substrate conductive layer may at least include a plurality of first connection lines 70 disposed in the display area 100 and the upper bezel area 310. The shape of the first connection line 70 may be a line shape of which the main body portion extends along the second direction Y, the first end of the first connection line 70 is connected to the lead line in the bonding area, and the second end of the first connection line 70 extends from the bonding area to the display area 100 and across the display area 100 to the upper bezel area 310.

In an exemplary implementation, an end of the first connection line 70 away from the display area 100 (the second end of the first connection line 70) is provided with a first connection block 73 that may be a rectangle. The first connection block 73 and the first connection line 70 may be connected to each other to form an integrated structure, and the first connection block 73 is configured to connect with a second connection line formed subsequently through a first lap via.

In an exemplary implementation, the first connection block 73 may be disposed at a side of the encapsulation line FX away from the display area.

In an exemplary implementation, the plurality of first connection lines 70 may be arranged at intervals along the first direction X, and the positions of the plurality of first connection lines 70 may be arranged according to the uniformity of wiring, which is not limited in the present disclosure.

In an exemplary implementation, the material of the first flexible layer and the second flexible layer may include, but is not limited to, one or more of polyethylene glycol terephthalate, polyethylene terephthalate, polyether-ether-ketone, polystyrene, polycarbonate, polyarylate, polyary-lester, polyimide, polyvinyl chloride, polyethylene, and tex-tile fibers. The material of the first barrier layer and the second barrier layer may include, but is not limited to, one or more of a silicon oxide (SiOx), a silicon nitride (SiNx), and a silicon oxynitride (SiON), which may form a single layer, a multi-layer, or a composite layer for improving the water-oxygen resistance of the base substrate. The base substrate conductive layer may be made of a metal material, such as any one or more of silver (Ag), copper (Cu), aluminum (Al), and molybdenum (Mo), or an alloy material of the aforementioned metals. For example, the base substrate conductive layer may be molybdenum.

In an exemplary implementation, the base substrate con-ductive layer may adopt a titanium/aluminum/titanium (Ti/Al/Ti) composite structure, which is beneficial to reduce the resistance of the first connection line. Although the length of the first connection line is increased by extending the first connection line to the upper bezel area, the resistance of the first connection line can be effectively reduced by structural designs such as multi-film layer and multiple lines in par-allel.

In the display substrate according to exemplary embodi-ments of the present disclosure, a base substrate conductive layer is provided between the two flexible layers of the base substrate, and the base substrate conductive layer includes a first connection line for implementing fan-out function in the display area and the bezel area, which is beneficial to reduce the wiring density in the bonding area.

(2) A pattern of a semiconductor layer is formed. In an exemplary implementation, forming the pattern of the semi-conductor layer may include: depositing sequentially a first insulation thin film and a semiconductor thin film on a base substrate, and patterning the semiconductor thin film through a patterning process to form a first insulation layer covering the base substrate and the pattern of the semicon-ductor layer disposed on the first insulation layer, as shown in FIG. 11.

In an exemplary implementation, the pattern of the semi-conductor layer of each circuit unit in the display area may at least include a first active layer 11 of the first transistor T1 to a seventh active layer 17 of the seventh transistor T7, and the first active layer 11 to the seventh active layer 17 are connected with each another to form an integral structure. In a second direction Y, a sixth active layer 16 in sub-pixels in a unit row and a seventh active layer 17 in sub-pixels in next unit row are connected with each other.

In an exemplary implementation, in a first direction X, the second active layer 12 and the sixth active layer 16 may be located on a same side of the third active layer 13 in the circuit unit, the fourth active layer 14 and the fifth active layer 15 may be located on a same side of the third active layer 13 in the circuit unit, and the second active layer 12 and the fourth active layer 14 may be located on different sides of the third active layer 13 of the circuit unit. In the second direction Y, the first active layer 11, the second active layer 12, and the fourth active layer 14, and the seventh active layer 17 may be located on a side of the third active layer 13 in the circuit unit in a direction opposite to the second direction Y, and the fifth active layer 15 and the sixth active layer 16 may be located at a side of the third active layer 13 in the circuit unit in a second direction Y.

In an exemplary implementation, a shape of the first active layer 11 may be an "n" shape, shapes of the second active layer 12 and the fifth active layer 15 may be an "L" shape, a shape of the third active layer 13 may be an "Ω" shape, shapes of the fourth active layer 14, the sixth active layer 16, and the seventh active layer 17 may be an "I" shape.

In an exemplary implementation, an active layer of each transistor may include a first area, a second area, and a channel area located between the first area and the second area. In an exemplary implementation, a first area 11-1 of the first active layer 11 may serve as a first area 17-1 of the seventh active layer 17; a second area 11-2 of the first active layer 11 may serve as a first area 12-1 of the second active layer 12; a first area 13-1 of the third active layer 13 may serve as a second area 14-2 of the fourth active layer 14 and a second area 15-2 of the fifth active layer 15 simultaneously; a second area 13-2 of the third active layer 13 may serve as a second area 12-2 of the second active layer 12 and a first area 16-1 of the sixth active layer 16 simultaneously; a second area 16-2 of the sixth active layer 16 may serve as a second area 17-2 of the seventh active layer 17; a first area 14-1 of the fourth active layer 14 and a first area 15-1 of the fifth active layer 15 may be separately provided.

Figure 12:
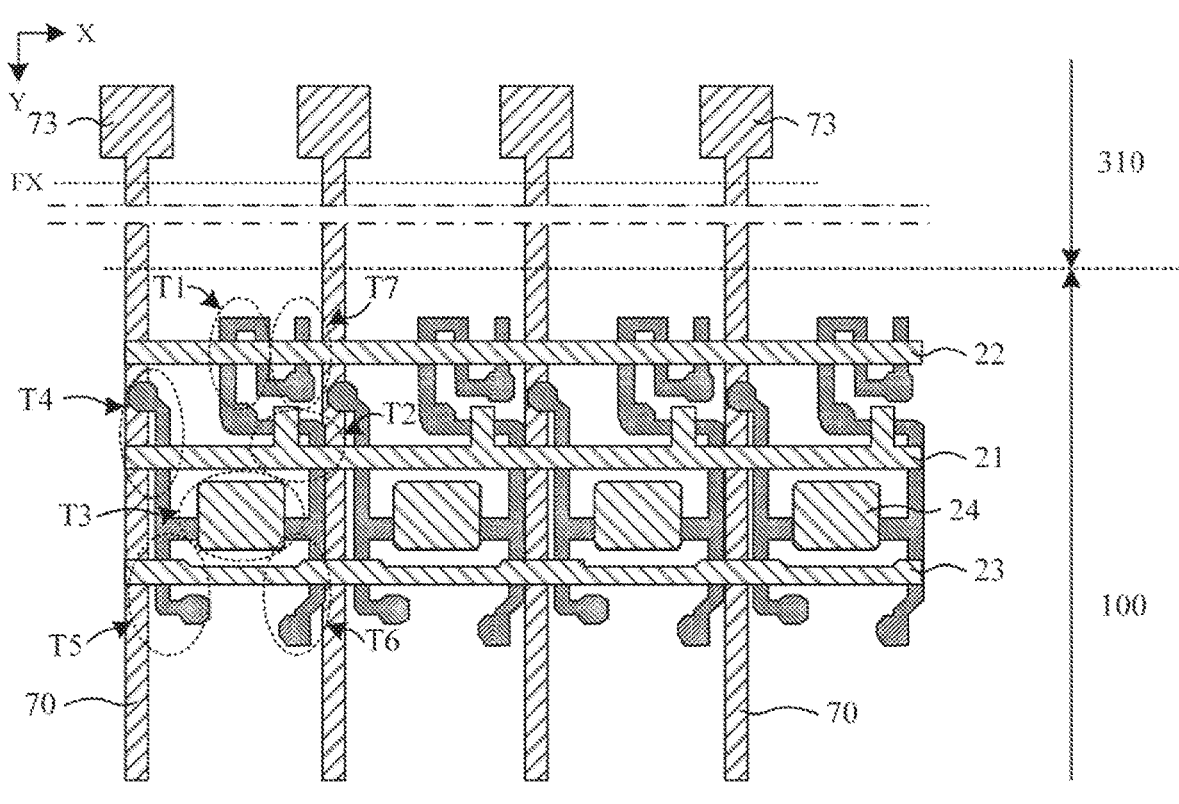
FIG. 12 is a schematic diagram of a display substrate after a first conductive layer is formed according to an embodiment of the present disclosure.

(3) A pattern of a first conductive layer is formed. In an exemplary implementation, forming a pattern of a first conductive layer may include: sequentially depositing a second insulation thin film and a first conductive film on the base substrate on which the aforementioned pattern is formed, patterning the first conductive film by a patterning process to form a second insulation layer covering the pattern of the semiconductor layer and a pattern of a first conductive layer disposed on the second insulation layer, as shown in FIG. 12. In an exemplary implementation, the first conductive layer may be referred to as a first gate metal (GATE1) layer.

In an exemplary implementation, the pattern of the first conductive layer of each circuit unit in the display area may at least include the first scanning signal line 21, the second scanning signal line 22, the light emitting control line 23, the first plate 24 of the storage capacitor.

In an exemplary implementation, the first plate 24 of the storage capacitor may be in a shape of a rectangle, and chamfers may be provided at corners of the rectangle. An orthographic projection of the first plate 24 on the base substrate is at least partially overlapped with an orthographic projection of a third active layer of a third transistor T3 on the base substrate. In an exemplary implementation mode, the first plate 24 may serve as one plate of the storage capacitor and a gate electrode of the third transistor T3 simultaneously.

In an exemplary implementation, the shape of the first scan signal line 21 may be a line shape whose main body part extends along the first direction X, and the first scan signal line 21 may be located on the side of the first plate 24 of the current circuit unit in the opposite direction of the second direction Y. The first scan signal line 21 of each circuit unit is provided with a gate block, a first end of the gate block is connected with the first scan signal line 21, and a second end of the gate block extends towards a direction away from the first plate. An area where the first scan signal line 21 and the gate block are overlapped with the second active layer of the present circuit unit serves as a gate electrode of the second transistor T2 of a double-gate structure, and an area where the first scan signal line 21 is overlapped with the fourth active layer of the present circuit unit serves as a gate electrode of the fourth transistor T4.

In an exemplary implementation, the second scan signal line 22 may be in a line shape, the main body part of the second scan signal line 22 extends along the first direction X, the second scan signal line 22 may be located at a side of the first scan signal line 21 of the present circuit unit away from the first plate 24, an area where the second scan signal line 22 is overlapped with the first active layer of the present circuit unit serves as a gate electrode of the first transistor T1 of a double-gate structure, and an area where the second scan signal line 22 is overlapped with the seventh active layer of the present circuit unit serves as a gate electrode of the seventh transistor T7.

In an exemplary implementation, the light emitting control line 23 may be in a line shape, the main body part of the light emitting control line 23 extends along the first direction X, the light emitting control line 23 may be located at a side of the first plate 24 of the present circuit unit in the second direction Y, an area where the light emitting control line 23 is overlapped with the fifth active layer of the present circuit unit serves as a gate electrode of the fifth transistor T5, and an area where the light emitting control line 23 is overlapped with the sixth active layer of the present circuit unit serves as a gate electrode of the sixth transistor T6.

In an exemplary implementation, the first scan signal line 21, the second scan signal line 22, and the light emitting control line 23 may be in an equal width design, or may be in a non-equal width design, may be straight lines, or may be bend lines, which may not only facilitate the layout of the pixel structure, but also reduce the parasitic capacitance between the signal lines, and this is not limited in the present disclosure.

In an exemplary implementation, after the pattern of the first conductive layer is formed, the semiconductor layer may be subjected to a conductive treatment by using the first conductive layer as a shield. An area of the semiconductor layer, which is shielded by the first conductive layer, forms channel areas of the first transistor T1 to the seventh transistor T7, and an area of the semiconductor layer, which is not shielded by the first conductive layer, is made to be conductive, that is, first areas and second areas of the active layers of the first transistor T1 to the seventh transistor T7 are all made to be conductive.

Figure 13:
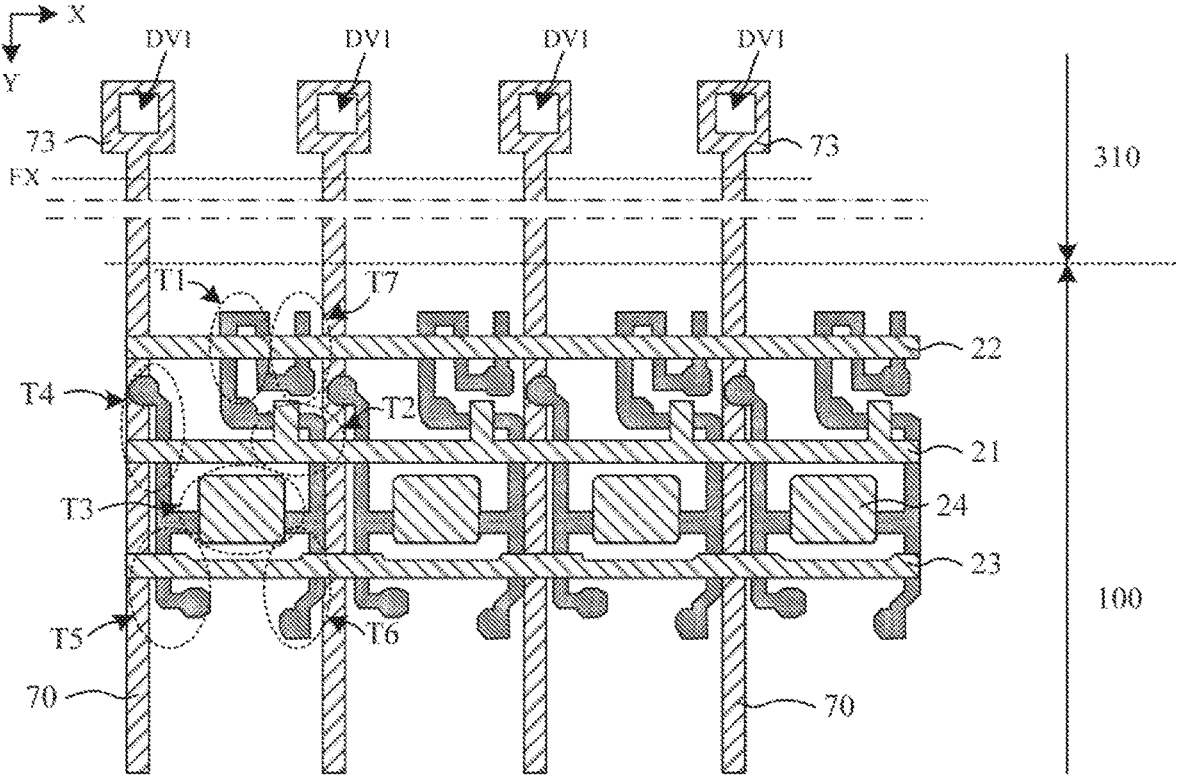
FIG. 13 is a schematic diagram of a display substrate after a first lapping via is formed according to an embodiment of the present disclosure.

(4) A pattern of a first lapping via is formed. In an exemplary implementation, forming a pattern of a first lapping via may include: depositing a third insulation thin film on the base substrate on which the aforementioned pattern is formed, patterning the third insulation thin film by a patterning process to form a third insulation layer covering the first conductive layer and form a plurality of first lapping vias DV1 on the third insulation layer, as shown in FIG. 13.

In an exemplary implementation, the plurality of first lapping vias DV1 may be provided at a side of the encapsulation line FX away from the display area 100, i.e., the first lapping vias DV1 may be provided in the non-encapsulation area within the upper bezel area 310.

In an exemplary implementation, an orthographic projection of the first lapping via DV1 on the base substrate may be located within a range of an orthographic projection of the first connection block 73 on the base substrate, the third insulation layer, the second insulation layer, the first insulation layer, the second barrier layer and the second flexible layer in the first lapping via DV1 are removed to expose a surface of the first connection block 73, the first lapping via DV1 is configured to connect the second connection line formed subsequently with the first connection block 73.

In an exemplary implementation, the area of the first lapping via DV1 may be smaller than the area of the first connection block 73, a first width between the edge of the first lapping via DV1 and the edge of the first connection block 73 may be greater than or equal to 2.5 μm, and the first width may be a dimension in a direction away from the first lapping via DV1.

In an exemplary implementation, the shape of the first lapping via DV1 can be any one or more of the following: triangle, rectangle, pentagon, hexagon, circle and ellipse.

Figure 14:
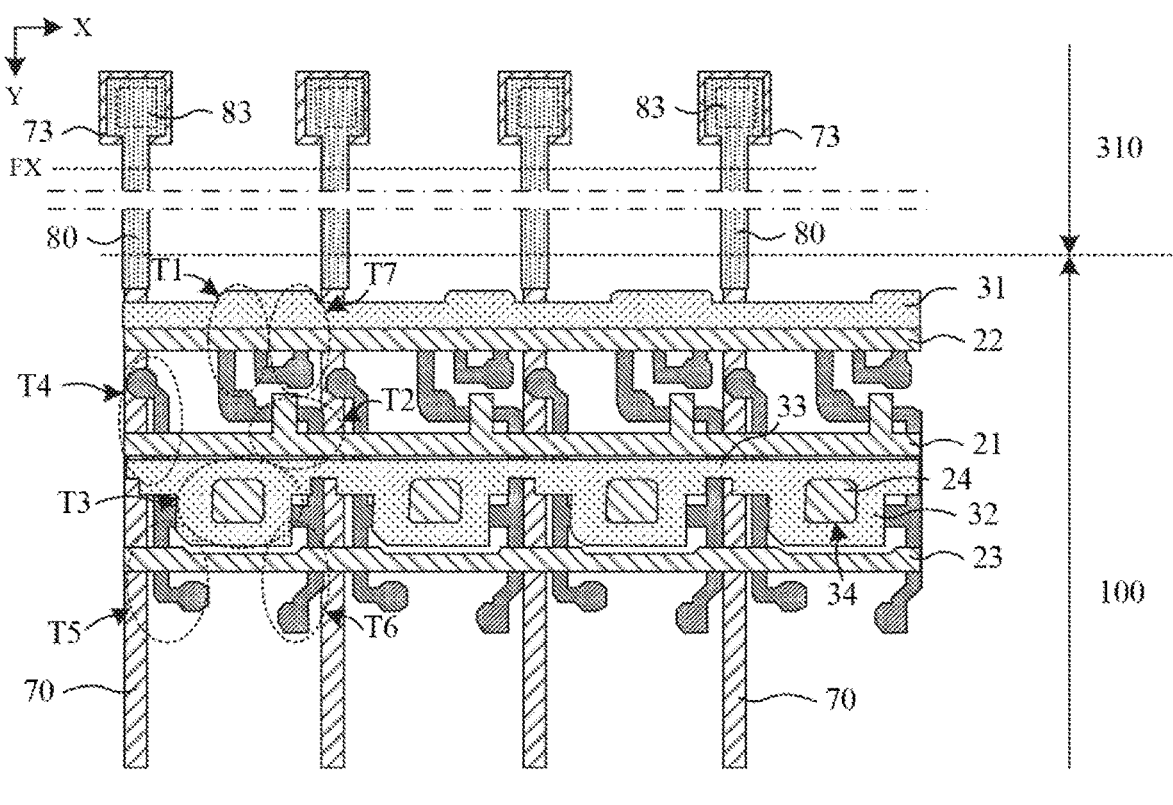
FIG. 14 is a schematic diagram of a display substrate after a second conductive layer is formed according to an embodiment of the present disclosure.

(5) A pattern of a second conductive layer is formed. In an exemplary implementation, forming a pattern of second conductive layer may include: depositing a second conductive thin film on the substrate on which the aforementioned pattern is formed, patterning the second conductive film by a patterning process to form a pattern of a second conductive layer on the third insulation layer, as shown in FIG. 14. In an exemplary implementation, the second conductive layer may be referred to as a second gate metal (GATE2) layer.

In an exemplary implementation, the pattern of second conductive layer of each circuit unit in the display area at least includes an initial signal line 31, a second plate 32 of a storage capacitor and a plate connection line 33.

In an exemplary implementation, a profile of the second plate 32 may be a rectangle, corners of the rectangle may be provided with a chamfer. An orthographic projection of the second plate 32 on the base substrate is at least partially overlapped with an orthographic projection of the first plate 24 on the base substrate. The second plate may serve as the other plate of the storage capacitor, the first plate 24 and the second plate 32 form the storage capacitor of the pixel driving circuit.

In an exemplary implementation, the second plate 32 is provided with an opening 34 which may have a rectangular shape and may be located in the middle of the second plate 32, so that the second plate 32 forms an annular structure. The opening 34 exposes the third insulation layer covering the first plate 24, and an orthographic projection of the first plate 24 on the base substrate contains an orthographic projection of the opening 34 on the base substrate. In an exemplary implementation, the opening 34 is configured to accommodate a first via subsequently formed, wherein the first via is located within the opening 34 and exposes the first plate 24, so that a second electrode of the first transistor T1 subsequently formed is connected with the first plate 24.

In an exemplary implementation, the second plates 32 of two adjacent sub-pixels in one unit row are connected with each other by a plate connection line 33. In an exemplary implementation, because the second plate 32 in each circuit unit is connected with a first power supply line formed subsequently, second plates 32 in adjacent circuit units are connected with each other to form an integral structure in which the second plates may be reused as power supply signal lines as well, and ensure potential equalization between a plurality of second plates in one unit row, which is beneficial to improving uniformity of a panel and avoiding a poor display of the display substrate, thereby ensuring a display effect of the display substrate.

In an exemplary implementation, the initial signal line 31 may be of a line shape in which a main part extends along the first direction X. The initial signal line 31 may be located on a side of the second scan signal line 22 of the circuit unit away from the first scan signal line 21, and the initial signal line 31 is configured to connect with a first electrode of the first transistor T1 formed subsequently (is also a first electrode of the seventh transistor T7).

In an exemplary implementation, the pattern of the second conductive layer may include a plurality of second connection lines 80. The shape of the second connection line 80 may be a line shape of which the main body portion extends in the second direction Y, and an end of the second connection line 80 away from the display area 100 (a first end of the second connection line 80) is provided with a second connection block 83, the second connecting block 83 may be in a rectangular shape, and the second connection block 83 is connected to the first connection block 73 through the first lapping via DV1. A second end of the second connection line 80 extends to the display area 100 and the second end of the second connection line 80 is configured to connect with a data signal line formed subsequently.

In an exemplary implementation, the area of the second connection block 83 may be smaller than the area of the first connection block 73, the orthographic projection of the second connection block 83 on the base substrate is within the range of the orthographic projection of the first connection block 73 on the base substrate.

In an exemplary implementation, the second connection block 83 covers the first connection block 73 exposed inside the bottom of the first lapping via DV1 and covers the flexible layer and a plurality of inorganic layers exposed inside an inner wall of the first lapping via DV1, and the second connection block 83 covers the third insulation layer outside the first lapping via DV1.

In an exemplary implementation, a second width of the third insulation layer outside the first lapping via DV1 covered by the second connection block 83 may be greater than or equal to 2.5 μm, and the second width may be a dimension in a direction away from the first lapping via DV1.

Figure 15:
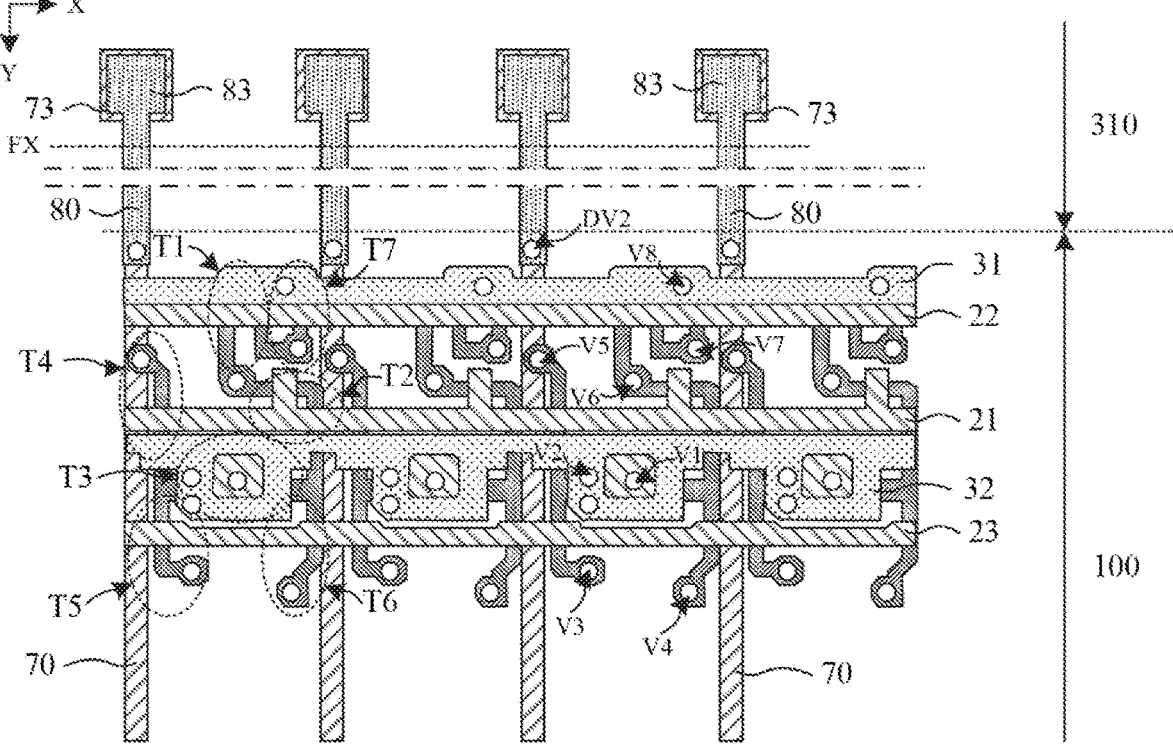
FIG. 15 is a schematic diagram of a display substrate after a fourth insulation layer is formed according to an embodiment of the present disclosure.

(6) A pattern of a fourth insulation layer is formed. In an exemplary implementation, forming a pattern of a fourth insulation layer may include: depositing a fourth insulation thin film on the base substrate on which the aforementioned patterns are formed, and patterning the fourth insulation thin film through a patterning process to form a fourth insulation layer covering the second semiconductor layer, wherein a plurality of vias are provided on the fourth insulation layer, as shown in FIG. 15.

In an exemplary implementation, the plurality of vias of each circuit unit in the display area at least include a first via V1, a second via V2, a third via V3, a fourth via V4, a fifth via V5, a sixth via V6, a seventh via V7, an eighth via V8.

In an exemplary implementation, an orthographic projection of the first via V1 on the base substrate is within a range of an orthographic projection of the opening 34 on the base substrate, the fourth insulation layer and the third insulation layer in the first via V1 are etched away to expose a surface of the first plate 24, and the first via V1 is configured such that the second electrode of the first transistor T1 formed subsequently (also is the first electrode of the second transistor T2) is connected with the first plate 24 through the via V1.

In an exemplary implementation, an orthographic projection of the second via V2 on the base substrate is within a range of an orthographic projection of the second plate 32 on the base substrate, the fourth insulation layer in the second via V2 is etched away to expose a surface of the second plate 32, and the second via V2 is configured such that the first power supply line formed subsequently is connected with the second plate 32 through the via V2. In an exemplary implementation, there may be a plurality of second vias V2, and the plurality of second vias V2 may be disposed in sequence along the second direction Y to improve connection reliability.

In an exemplary implementation, an orthographic projection of the third via V3 on the base substrate is within a range of an orthographic projection of the first area of the fifth active layer on the base substrate. The fourth insulation layer, the third insulation layer and the second insulation layer in the third via V3 are etched away to expose a surface of the first area of the fifth active layer, and the third via V3 is configured such that the first power supply line formed subsequently is connected with the first area of the fifth active layer through the via V3.

In an exemplary implementation, an orthographic projection of the fourth via V4 on the base substrate is within a range of an orthographic projection of the second area of the sixth active layer (also is the second area of the seventh active layer) on the base substrate. The fourth insulation layer, the third insulation layer and the second insulation layer in the fourth via V4 are etched away to expose a surface of the second area of the sixth active layer, and the fourth via V4 is configured such that the second electrode of the sixth transistor T6 formed subsequently (also is the second electrode of the seventh transistor T7) is connected with the second area of the sixth active layer through the via V4.

In an exemplary implementation, an orthographic projection of the fifth via V5 on the base substrate is within a range of an orthographic projection of the first area of the fourth active layer on the base substrate. The fourth insulation layer, the third insulation layer and the second insulation layer in the fifth via V5 are etched away to expose a surface of the first area of the fourth active layer, and the fifth via V5 is configured such that the data signal line formed subsequently is connected with the first area of the fourth active layer through the via V5.

In an exemplary implementation, an orthographic projection of the sixth via V6 on the base substrate is within a range of an orthographic projection of the second area of the first active layer (also is the first area of the second active layer) on the base substrate. The fourth insulation layer, the third insulation layer and the second insulation layer in the sixth via V6 are etched away to expose a surface of the second area of the first active layer, the sixth via V6 is configured such that the second electrode of the first transistor T1 formed subsequently (also is the first electrode of the second transistor T2) is connected with the second area of the first active layer (also is the first area of the second active layer) through the via V6.

In an exemplary implementation, an orthographic projection of the seventh via V7 on the base substrate is within a range of an orthographic projection of the first area of the first active layer (also is the first area of the seventh active layer) on the base substrate. The fourth insulation layer, the third insulation layer and the second insulation layer in the seventh via V7 are etched away to expose a surface of the first area of the first active layer, the seventh via V7 is configured such that the first electrode of the first transistor T1 formed subsequently (also is the first electrode of the seventh transistor T7) is connected with the first area of the first active layer (also is the first area of the seventh active layer) through the via V7.

In an exemplary implementation, an orthographic projection of the eighth via V8 on the base substrate is within a range of an orthographic projection of the initial signal line 31 on the base substrate. The fourth insulation layer in the eighth via V8 is etched away to expose a surface of the initial signal line 31, the eighth via V8 is configured such that the first electrode of the first transistor T1 formed subsequently (also is the first electrode of the seventh transistor T7) is connected with the initial signal line 31 through the eighth via V8.

In an exemplary implementation, the fourth insulation layer may further be provided with a second lapping via DV2 which may be provided in a portion of the circuit units. An orthographic projection of second lapping via DV2 on the base substrate is within a range of an orthographic projection of the second end of a second connection line 80 on the base substrate, the fourth insulation layer in the second lapping via DV2 is etched away to expose a surface of the second end of the second connection line 80, and the second lapping via DV2 is configured to connect the data signal line formed subsequently to the second connection line 80 through the second lapping via DV2.

In an exemplary implementation, the orthographic projection of the second lapping via DV2 on the base substrate is not overlapped with an orthographic projection of the first lapping via on the base substrate.

Figure 16:
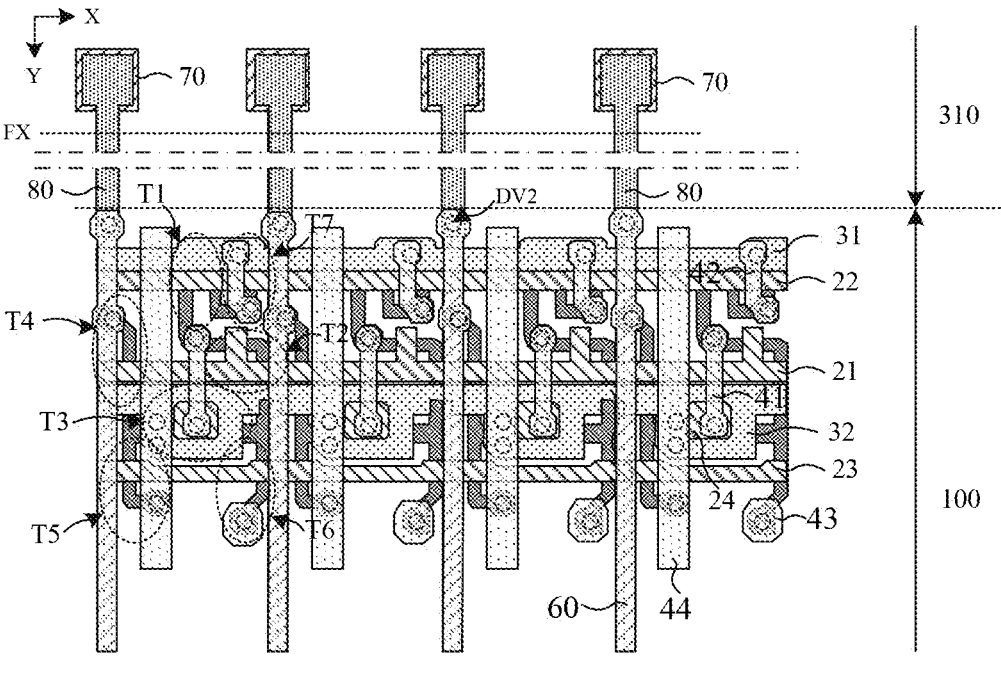
FIG. 16 is a schematic diagram of a display substrate after a third conductive layer is formed according to an embodiment of the present disclosure.

(7) A pattern of a third conductive layer is formed. In an exemplary implementation, forming a third conductive layer may include: depositing a third conductive thin film on the base substrate on which the above-mentioned patterns are formed, and patterning the third conductive thin film through a patterning process to form a third conductive layer disposed on the fourth insulating layer, as shown in FIG. 16. In an exemplary implementation, the third conductive layer may be referred to as a first source drain metal (SD1) layer.

In an exemplary implementation, the third conductive layer of each circuit unit in the display area at least includes a first connection electrode 41, a second connection electrode 42, a third connection electrode 43, a first power supply line 44, and a data signal line 60.

In an exemplary implementation, the first connection electrode 41 may be of a strip shape in which a main body part extends along the second direction Y. The first end of the first connection electrode 41 is connected with the first plate 24 through the first via V1, and the second end of the first connection electrode 41 is connected with the second area of the first active layer (also is the first area of the second active layer) through the sixth via V6, so that the first plate 24, the second area of the first active layer and the first area of the second active layer have same potential. In an exemplary implementation, the first connection electrode 41 may serve as the second electrode of the first transistor T1 and the first electrode of the second transistor T2 simultaneously.

In an exemplary implementation, the second connection electrode 42 may be of a strip shape in which a main body part extends along the second direction Y. A first end of the second connection electrode 42 is connected with the initial signal line 31 through the eighth via V8, and a second end of the second connection electrode 42 is connected with the first area of the first active layer (also is a first area of the seventh active layer) through the seventh via V7. In an exemplary implementation, the second connection electrode 42 may serve as the first electrode of the first transistor T1 and the first electrode of the seventh transistor T7 simultaneously.

In an exemplary implementation, the third connection electrode 43 may be of a block shape, and the third connection electrode 43 is connected with the second area of the sixth active layer (also is the second area of the seventh active layer) through the fourth via V4. In an exemplary implementation, the third connection electrode 43 may serve as the second electrode of the sixth transistor T6 and the second electrode of the seventh transistor T7 simultaneously, and the third connection electrode 43 is configured to be connected with an anode connection electrode formed subsequently.

In an exemplary implementation, the first power supply line 44 may be of a straight line shape of which the main body part extends along the second direction Y. On one hand, the first power supply line 44 is connected with the second plate 32 through the second via V2. On the other hand, the first power supply line 44 is connected with the first area of the fifth active layer through the third via V3. In this way, a power supply signal is written to the first electrode of the fifth transistor T5, and the second plate 32 and the first electrode of the fifth transistor T5 have the same potential.

In an exemplary implementation, the data signal line 60 may be of a straight line shape of which the main body part extends along the second direction Y. The data signal line 60 is connected with a first area of the fourth active layer through the fifth via V5, such that a data signal is written to the first electrode of the fourth transistor T4.

In an exemplary implementation, the data signal line 60 is connected with the second connection line 80 through the second lapping via DV2. Because the second connection line 80 is connected with the first connection line 70 through the first lap via, the data signal line 60 in the display area 100 is connected with the lead line in the bonding area through the first connection line 70 and the second connection line 80.

The subsequent manufacturing process may include forming a first planarization layer, forming a fourth conductive layer, forming a second planarization layer and the like, and the driving circuit layer is manufactured on the glass carrier plate.

In an exemplary implementation, the connection structure of the first connection line and the second connection line in the side bezel area is substantially same as the connection structure of the first connection line and the second connection line in the upper side bezel area, which will not be repeated here.

In an exemplary implementation, on a plane parallel to the display substrate, the driving circuit layer in the display area may include a plurality of circuit units, each of which may include a pixel driving circuit that is connected with a first scan signal line 21, a second scan signal line 22, a light emitting control line 23, an initial signal line 31, a first power supply line 44 and a data signal line 60, respectively. The driving circuit layer of the display area and the bezel area may include a plurality of first connection lines 70 and a plurality of second connection lines 80, the plurality of second connection lines 80 are connected to the first connection line 70 through the first lapping vias DV1, the data signal lines 60 are connected to the second connection lines 80 through the second lapping vias DV2.

In an exemplary implementation, on a plane perpendicular to the display substrate, the driving circuit layer may be disposed on the base substrate. The base substrate may include a first flexible layer 10A, a first barrier layer 10B, a base conductive layer, a second flexible layer 10C and a second barrier layer 10D which are stacked, and the base conductive layer may at least include a first connection line 70 located in the display area and the bezel area. The driving circuit layer may at least include a first insulation layer, a semiconductor layer, a second insulation layer, a first conductive layer, a third insulation layer, a second conductive layer, a fourth insulation layer and a third conductive layer stacked in sequence on the base substrate. The semiconductor layer may at least include active layers of the first transistor to the seventh transistor, the first conductive layer may at least include a first scan signal line 21, a second scan signal line 22, a light emitting control line 23, and a first plate 24 of a storage capacitor, and the second conductive layer may at least include an initial signal line 31, a second plate 32 of the storage capacitor, a plate connection line 33, and a second connection line 80, wherein the second connection line 80 is connected to the first connection line 70 through a first lapping via DV1. The third conductive layer may at least include a first connection electrode 41, a second connection electrode 42, a third connection electrode 43, a first power supply line 44, and the data signal line 60, the data signal line 60 are connected to the second connection line 80 through a second lapping via DV2.

In an exemplary implementation, the first conductive layer, the second conductive layer and the third conductive layer may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first insulation layer may be referred to as a buffer layer, the second insulation layer and the third insulation layer may be referred to as Gate Insulator (GI) layers, and the fourth insulation layer may be referred to as an Interlayer Dielectric (ILD) layer. The semiconductor layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the embodiments of the present disclosure is suitable for thin film transistors manufactured on basis of Oxide technology, silicon technology or organics technology In an exemplary implementation, after the driving circuit layer is manufactured, a light emitting structure layer and an encapsulation structure layer are manufactured in sequence on the driving circuit layer. Preparing the light emitting structure layer may include: an anode conductive layer is formed at first, wherein the anode conductive layer may at least include a plurality of anode patterns. Then a pixel definition layer is formed, and the pixel definition layer of each circuit unit is provided with an opening in which the pixel definition layer is removed to expose an anode of the circuit unit where the pixel definition layer is located. Then, an organic emitting layer is formed using an evaporation or ink-jet printing process, and a cathode is formed on the organic light emitting layer. The encapsulation structure layer may include a first encapsulation layer, a second encapsulation layer, and a third encapsulation layer that are stacked. The first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water and oxygen cannot enter the light emitting structure layer.

In an exemplary implementation, the encapsulation structure layer may be formed in the display area and the bezel area, and the encapsulation structure layer in the bezel area may be located at a side of the encapsulation line FX close to the display area.

As can be seen from the structure and the manufacturing process of the display substrate described above, in the display substrate provided in the present disclosure, a base substrate conductive layer is disposed between two flexible layers of the base substrate, the base substrate conductive layer includes the first connection line, and the first connection line is connected with the data signal line through the second connection line, thus data wiring in the display area is achieved, which may reduce the width of the lower bezel and is beneficial to achieving a full-screen display.

In a display substrate adopting a FIAA structure, a first lapping via for connecting a first connection line with a second connection line and a second lapping via for connecting the second connection line with a data signal line are provided in the display area. A research shows that, because the film layer dig by the first lapping via includes the second flexible layer, the first lapping via is relatively deep and is about 5 μm to 8 μm in depth, and the organic material layer is filled in the first lapping via, so that the encapsulation failure is easy to occur in the area of the first lapping via, and external water and oxygen will invade the light emitting structure layer through the first lapping via, which will affect the reliability life of the display apparatus. In the display substrate provided by the exemplary embodiment of the present disclosure, the first lapping via connecting the first connection line and the second connection line is disposed at a side of the encapsulation line away from the display area, i.e., the first lapping via is disposed outside the encapsulation area, so that there is no organic material layer inside the first lapping via and no water and oxygen intrusion path is formed, which can not only avoid encapsulation failure caused by the first lapping via and reduce design risk, but also effectively reduce the difficulty of the encapsulation process and reduce the reliability risk of the encapsulation, and maximize the process quality and product quality. In addition, in the present disclosure, the process quality of opening the first lapping via is effectively guaranteed by providing the first lapping via outside the isolation dam. And a first lapping via with a greater depth has less influence on the film structure of the display area, occupies less space and has low production cost. The manufacturing processes in the present disclosure may be compatible well with existing manufacturing processes, which are simple in process implementation, easy to implement, high in production efficiency and yield, and low in production cost.

The structure shown and mentioned above in the present disclosure and the manufacturing process thereof are merely an exemplary description. In an exemplary implementation, the corresponding structures may be altered and the patterning processes may be added or reduced according to actual needs. For example, the display substrate may include a shielding conductive layer. As another example, the second connection line may be provided in the shielding conductive layer or the first conductive layer, which is not limited in the present disclosure.

In an exemplary implementation, the display substrate of the present disclosure may be applied to other display devices having pixel drive circuits, such as quantum dot displays and the like, which is not limited in the present disclosure.

The present disclosure further provides a manufacturing method for a display substrate to manufacture the display substrate provided by the embodiments described above. In an exemplary implementation, the display substrate includes a display area, a bonding area located at a side of the display area and a bezel area located at other sides of the display area; the manufacturing method includes:

forming a base substrate, wherein the base substrate at least includes a first flexible layer, a second flexible layer, and a base substrate conductive layer disposed between the first flexible layer and the second flexible layer, the base conductive layer at least includes a first connection line;

forming a driving circuit layer on the base substrate, wherein the driving circuit layer at least includes a data signal line and a second connection line, the second connection line is connected with the first connection line through a first lapping via, the data signal line is connected with the second connection line through a second lapping via, the first lapping via is provided in the bezel area.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present invention are not limited thereto.

Although implementations disclosed in the present disclosure are described as above, the described contents are only implementations which are used for facilitating understanding the present disclosure, but are not intended to limit the present invention. Any skilled person in the art to which the present disclosure pertains may make any modification and variation in forms and details of implementation without departing from the spirit and scope of the present disclosure. However, the patent protection scope of the present disclosure should be subject to the scope defined in the appended claims.

The invention claimed is:

1. A display substrate, comprising: a display area; a bonding area located at a side of the display area; and a bezel area located at other sides of the display area, wherein:

in a direction perpendicular to the display substrate, the display substrate comprises a base substrate and a driving circuit layer disposed on the base substrate, the base substrate at least comprises a first flexible layer, a second flexible layer and a base substrate conductive layer disposed between the first flexible layer and the second flexible layer, the base substrate conductive layer at least comprises a first connection line, the driving circuit layer at least comprises a data signal line and a second connection line, the second connection line is connected with the first connection line through a first lapping via hole, the data signal line is connected with the second connection line through a second lapping via hole, and the first lapping via hole is provided in the bezel area; and the bonding area at least comprises a plurality of lead lines, first ends of the plurality of lead lines are correspondingly connected with an integrated circuit in the bonding area, second ends of the plurality of lead lines are correspondingly connected with first ends of a plurality of first connection lines, second ends of the plurality of first connection lines pass through the display area from the bonding area and extend to the bezel area and then connected with first ends of second connection lines through the first lapping via hole, second ends of the second connection lines extend from the bezel area to the display area and then connected with the data signal line through the second lapping via hole.

2. The display substrate according to claim 1, wherein the driving circuit layer at least comprises a first conductive layer, a second conductive layer and a third conductive layer that are sequentially disposed on the base substrate, the second connection line is disposed in the second conductive layer, the data signal line is disposed in the third conductive layer.

3. The display substrate according to claim 2, wherein the bonding area is located at a side of the display area in a second direction, the bezel area at least comprises an upper bezel area located at a side of the display area away from the bonding area and a side bezel area located at at least one side of the display area in a first direction, the first direction is intersected with the second direction, and the first lapping via hole is respectively provided in the upper bezel area and the side bezel area.

4. The display substrate according to claim 1, wherein an orthographic projection of the second connection line on the base substrate is at least partially overlapped with an orthographic projection of the first connection line on the base substrate.

5. The display substrate according to claim 4, wherein the orthographic projection of the second connection line on the base substrate is located within a range of the orthographic projection of the first connection line on the base substrate.

6. The display substrate according to claim 1, wherein a first width between an edge of the first lapping via hole and an edge of the first connection line is greater than or equal to 2.5 μm, and the first width is a dimension in a direction away from the first lapping via hole.

7. The display substrate according to claim 1, wherein the second connection line covers the first connection line exposed by a bottom inside the first lapping via hole and an inorganic layer exposed by a sidewall inside the first lapping via hole, and the second connection line covers an insulation layer outside the first lapping via hole, a second width of the insulation layer covered by the second connection line is greater than or equal to 2.5 μm, and the second width is a dimension in a direction away from the first lapping via hole.

8. The display substrate according to claim 1, wherein the second lapping via hole is provided at a side of the display area away from the bonding area.

9. The display substrate according to claim 1, wherein the bonding area is located at a side of the display area in a second direction, the bezel area at least comprises an upper bezel area located at a side of the display area away from the bonding area and a side bezel area located at at least one side of the display area in a first direction, the first direction is intersected with the second direction, and the first lapping via hole is respectively provided in the upper bezel area and the side bezel area.

10. The display substrate according to claim 9, wherein the upper bezel area comprises a first encapsulation area and a first non-encapsulation area divided by an encapsulation line, the encapsulation line is a boundary of an encapsulation structure layer covering the upper bezel area, the first encapsulation area is disposed at a side of the encapsulation line close to the display area, the first non-encapsulation area is disposed at a side of the encapsulation line away from the display area, and the first lapping via hole is provided in the first non-encapsulation area.

11. The display substrate according to claim 10, wherein the first encapsulation area at least comprises a plurality of electrostatic discharge circuits, at least one electrostatic discharge circuit of the plurality of electrostatic discharge circuits at least comprises an electrostatic transistor and an electrostatic capacitor, an orthographic projection of the first connection line on the base substrate is not overlapped with orthographic projections of the electrostatic transistor and the electrostatic capacitor in the electrostatic discharge circuit on the base substrate, and an orthographic projection of the second connection line on the base substrate is not overlapped with the orthographic projections of the electrostatic transistor and the electrostatic capacitor in the electrostatic discharge circuit on the base substrate.

12. The display substrate according to claim 9, wherein the side bezel area comprises a second encapsulation area and a second non-encapsulation area divided by an encapsulation line, the encapsulation line is a boundary of an encapsulation structure layer covering the side bezel area, the second encapsulation area is disposed at a side of the encapsulation line close to the display area, the second non-encapsulation area is disposed at a side of the encapsulation line away from the display area, and the first lapping via hole is provided in the second non-encapsulation area.

13. The display substrate according to claim 12, wherein the second encapsulation area at least comprises a plurality of row driving circuits, at least one row driving circuit of the plurality of row driving circuits at least comprises a row driving transistor and a row driving capacitor, an orthographic projection of the first connection line on the base substrate is not overlapped with orthographic projections of the row driving transistor and the row driving capacitor in the row driving circuit on the base substrate, and an orthographic projection of the second connection line on the base substrate is not overlapped with the orthographic projections of the row driving transistor and row driving capacitor in the row driving circuit on the base substrate.

14. The display substrate according to claim 13, wherein the row driving circuit is connected to a clock signal line configured to output a clock signal to the row driving circuit, the row driving circuit outputs a scan signal according to the clock signal, the clock signal line is respectively provided in the upper bezel area and the side bezel area.

15. The display substrate according to claim 14, wherein the clock signal line of the upper bezel area is provided with a fracture, and the fracture cuts off the clock signal line of the upper bezel area.

16. The display substrate according to claim 9, wherein the bezel area further comprises a bezel corner at a junction area of the upper bezel area and the side bezel area, and the bezel corner is provided with at least one first lapping via hole, at least one first connection line and at least one second connection line.

17. The display substrate according to claim 16, wherein the bezel corner is provided with at least one dummy lapping via hole, at least one first dummy line and at least one second dummy line, the first dummy line is connected with the second dummy line through the dummy lapping via hole after the first dummy line is extended from the display area to the bezel corner, the second dummy line is extended from the bezel corner to the display area, and the second dummy line is not connected with the data signal line.

18. A display apparatus, comprising the display substrate according to claim 1.

19. A manufacturing method for a display substrate, wherein the display substrate comprises a display area, a bonding area located at a side of the display area and a bezel area located at other sides of the display area, the manufacturing method comprising:

forming a base substrate, wherein the base substrate at least comprises a first flexible layer, a second flexible layer, and a base substrate conductive layer disposed between the first flexible layer and the second flexible layer, the base conductive layer at least comprises a first connection line; and forming a driving circuit layer on the base substrate, wherein the driving circuit layer at least comprises a data signal line and a second connection line, the second connection line is connected with the first connection line through a first lapping via hole, the data signal line is connected with the second connection line through a second lapping via hole, the first lapping via hole is provided in the bezel area, wherein the bonding area at least comprises a plurality of lead lines, first ends of the plurality of lead lines are correspondingly connected with an integrated circuit in the bonding area, second ends of the plurality of lead lines are correspondingly connected with first ends of a plurality of first connection lines, second ends of the plurality of first connection lines pass through the display area from the bonding area and extend to the bezel area and then connected with first ends of second connection lines through the first lapping via hole, second ends of the second connection lines extend from the bezel area to the display area and then connected with the data signal line through the second lapping via hole.

* * * * *